United States Patent
Shibib et al.

(10) Patent No.: US 10,444,262 B2
(45) Date of Patent: Oct. 15, 2019

(54) VERTICAL SENSE DEVICES IN VERTICAL TRENCH MOSFET

(71) Applicant: Vishay-Siliconix, Santa Clara, CA (US)

(72) Inventors: M. Ayman Shibib, San Jose, CA (US); Wenjie Zhang, San Jose, CA (US)

(73) Assignee: VISHAY-SILICONIX, San Jose, CA (US)

( * ) Notice: Subject to any disclaimer, the term of this patent is extended or adjusted under 35 U.S.C. 154(b) by 0 days.

(21) Appl. No.: 15/634,901

(22) Filed: Jun. 27, 2017

(65) Prior Publication Data
US 2017/0322239 A1    Nov. 9, 2017

Related U.S. Application Data

(62) Division of application No. 14/830,324, filed on Aug. 19, 2015, now Pat. No. 10,234,486.
(Continued)

(51) Int. Cl.
*G01R 19/00* (2006.01)
*H01L 29/78* (2006.01)
(Continued)

(52) U.S. Cl.
CPC ......... *G01R 19/0092* (2013.01); *G01R 19/15* (2013.01); *H01L 21/0217* (2013.01);
(Continued)

(58) Field of Classification Search
CPC ... G01R 19/0092; G01R 19/15; H01L 21/308; H01L 29/407; H01L 21/32133;
(Continued)

(56) References Cited

U.S. PATENT DOCUMENTS

| 3,906,540 A | 9/1975 | Hollins |
| 4,641,174 A | 2/1987 | Baliga |

(Continued)

FOREIGN PATENT DOCUMENTS

| CN | 101180737 | 5/2008 |
| CN | 101626033 | 1/2010 |

(Continued)

OTHER PUBLICATIONS

Xiao et al., ("Current Sensing Trench Power MOSFET for Automotive Applications," 20th Annual IEEE Applied Power Electronics Conference and Exposition, vol. 2 pp. 766-770, APEC 2005.
(Continued)

*Primary Examiner* — Yasser A Abdelaziez

(57) ABSTRACT

Vertical sense devices in vertical trench MOSFET. In accordance with an embodiment of the present invention, a semiconductor device includes a main vertical trench metal oxide semiconductor field effect transistor (main-MOSFET). The main-MOSFET includes a plurality of parallel main trenches, wherein the main trenches comprise a first electrode coupled to a gate of the main-MOSFET, and a plurality of main mesas between the main trenches, wherein the main mesas comprise a main source and a main body of the main-MOSFET. The semiconductor device also includes a sense-diode. The sense-diode includes a plurality of sense-diode trenches, wherein each of the sense-diode trenches comprises a portion of one of the main trenches, and a plurality of sense-diode mesas between the source-FET trenches, wherein the sense-diode mesas comprise a sense-diode anode that is electrically isolated from the main source of the main-MOSFET.

19 Claims, 10 Drawing Sheets

Note that all 830 and 840 trenches are equidistant from each other

Related U.S. Application Data

(60) Provisional application No. 62/039,335, filed on Aug. 19, 2014.

(51) Int. Cl.

| | |
|---|---|
| *H01L 27/088* | (2006.01) |
| *H01L 27/06* | (2006.01) |
| *H01L 29/06* | (2006.01) |
| *G01R 19/15* | (2006.01) |
| *H01L 21/8234* | (2006.01) |
| *H01L 21/02* | (2006.01) |
| *H01L 21/28* | (2006.01) |
| *H01L 21/306* | (2006.01) |
| *H01L 21/308* | (2006.01) |
| *H01L 21/3213* | (2006.01) |
| *H01L 27/02* | (2006.01) |
| *H01L 29/417* | (2006.01) |
| *H01L 29/423* | (2006.01) |
| *H01L 29/66* | (2006.01) |
| *H01L 29/40* | (2006.01) |

(52) U.S. Cl.
CPC .. *H01L 21/02129* (2013.01); *H01L 21/28035* (2013.01); *H01L 21/308* (2013.01); *H01L 21/30604* (2013.01); *H01L 21/32133* (2013.01); *H01L 21/823487* (2013.01); *H01L 27/0207* (2013.01); *H01L 27/0629* (2013.01); *H01L 27/088* (2013.01); *H01L 29/0692* (2013.01); *H01L 29/407* (2013.01); *H01L 29/41741* (2013.01); *H01L 29/42372* (2013.01); *H01L 29/66666* (2013.01); *H01L 29/66734* (2013.01); *H01L 29/7813* (2013.01); *H01L 29/7815* (2013.01)

(58) Field of Classification Search
CPC ........... H01L 21/0217; H01L 21/28035; H01L 29/66666; H01L 21/30604; H01L 29/66734; H01L 27/0207; H01L 29/41741; H01L 21/02129; H01L 29/42372; H01L 21/823487; H01L 29/7815; H01L 29/7813; H01L 29/0692; H01L 27/088; H01L 27/0629
See application file for complete search history.

(56) References Cited

U.S. PATENT DOCUMENTS

| | | |
|---|---|---|
| 4,672,407 A | 6/1987 | Nakagawa et al. |
| 4,782,372 A | 11/1988 | Nakagawa et al. |
| 4,799,095 A | 1/1989 | Baliga |
| 4,823,172 A | 4/1989 | Mihara |
| 4,827,321 A | 5/1989 | Baliga |
| 4,857,986 A | 8/1989 | Kinugawa |
| 4,893,160 A | 1/1990 | Blanchard |
| 4,928,155 A | 5/1990 | Nakagawa et al. |
| 4,939,557 A | 7/1990 | Pao et al. |
| 4,967,243 A | 10/1990 | Baliga et al. |
| 4,969,027 A | 11/1990 | Baliga et al. |
| 5,021,840 A | 6/1991 | Morris |
| 5,055,896 A | 10/1991 | Williams et al. |
| 5,063,307 A | 11/1991 | Zommer |
| 5,072,266 A | 12/1991 | Bulucea et al. |
| 5,111,253 A | 5/1992 | Korman et al. |
| 5,168,331 A | 12/1992 | Yilmaz |
| 5,191,395 A | 3/1993 | Nishimura |
| 5,221,850 A | 6/1993 | Sakurai |
| 5,233,215 A | 8/1993 | Baliga |
| 5,245,106 A | 9/1993 | Cameron et al. |
| 5,366,914 A | 11/1994 | Takahashi et al. |
| 5,378,655 A | 1/1995 | Hutchings et al. |
| 5,387,528 A | 2/1995 | Hutchings et al. |
| 5,408,141 A | 4/1995 | Devore et al. |
| 5,430,315 A | 7/1995 | Rumennik |
| 5,477,071 A | 12/1995 | Hamamoto et al. |
| 5,525,821 A | 6/1996 | Harada et al. |
| 5,527,720 A | 6/1996 | Goodyear et al. |
| 5,567,634 A | 10/1996 | Hebert et al. |
| 5,578,508 A | 11/1996 | Baba et al. |
| 5,602,424 A | 2/1997 | Tsubouchi et al. |
| 5,621,234 A | 4/1997 | Kato |
| 5,648,283 A | 7/1997 | Tsang et al. |
| 5,674,766 A | 10/1997 | Darwish et al. |
| 5,689,128 A | 11/1997 | Hshieh et al. |
| 5,689,129 A | 11/1997 | Pearce |
| 5,696,396 A | 12/1997 | Tokura et al. |
| 5,770,878 A | 6/1998 | Beasom |
| 5,808,340 A | 9/1998 | Wollesen et al. |
| 5,814,858 A | 9/1998 | Williams |
| 5,877,538 A | 3/1999 | Williams |
| 5,965,904 A | 10/1999 | Ohtani et al. |
| 5,969,383 A | 10/1999 | Chang et al. |
| 5,998,836 A | 12/1999 | Williams |
| 5,998,837 A | 12/1999 | Williams |
| 6,008,520 A | 12/1999 | Darwish et al. |
| 6,031,265 A | 2/2000 | Hshieh |
| 6,049,108 A | 4/2000 | Williams et al. |
| 6,096,584 A | 8/2000 | Ellis-Monaghan et al. |
| 6,140,678 A | 10/2000 | Grabowski et al. |
| 6,153,896 A | 11/2000 | Omura et al. |
| 6,160,441 A | 12/2000 | Stratakos et al. |
| 6,168,996 B1 | 1/2001 | Numazawa et al. |
| 6,172,398 B1 | 1/2001 | Hshieh |
| 6,180,966 B1 | 1/2001 | Kohno et al. |
| 6,204,533 B1 | 3/2001 | Williams et al. |
| 6,211,018 B1 | 4/2001 | Nam et al. |
| 6,218,888 B1 | 4/2001 | Otsuki |
| 6,238,981 B1 | 5/2001 | Grebs |
| 6,242,775 B1 | 6/2001 | Noble |
| 6,245,615 B1 | 6/2001 | Noble et al. |
| 6,255,683 B1 | 7/2001 | Radens et al. |
| 6,268,242 B1 | 7/2001 | Williams et al. |
| 6,277,695 B1 | 8/2001 | Williams et al. |
| 6,281,547 B1 | 8/2001 | So et al. |
| 6,285,060 B1 | 9/2001 | Korec et al. |
| 6,291,298 B1 | 9/2001 | Williams et al. |
| 6,304,108 B1 | 10/2001 | Inn |
| 6,309,929 B1 | 10/2001 | Hsu et al. |
| 6,323,518 B1 | 11/2001 | Sakamoto et al. |
| 6,348,712 B1 | 2/2002 | Korec et al. |
| 6,351,009 B1 | 2/2002 | Kocon et al. |
| 6,359,308 B1 | 3/2002 | Hijzen et al. |
| 6,391,721 B2 | 5/2002 | Nakagawa |
| 6,404,007 B1 | 6/2002 | Mo et al. |
| 6,413,822 B2 | 7/2002 | Williams et al. |
| 6,462,376 B1 | 10/2002 | Wahl et al. |
| 6,483,171 B1 | 11/2002 | Forbes et al. |
| 6,489,204 B1 | 12/2002 | Tsui |
| 6,495,883 B2 | 12/2002 | Shibata et al. |
| 6,495,884 B2 | 12/2002 | Harada et al. |
| 6,498,071 B2 | 12/2002 | Hijzen et al. |
| 6,525,373 B1 | 2/2003 | Kim |
| 6,545,315 B2 | 4/2003 | Hshieh et al. |
| 6,548,860 B1 | 4/2003 | Hshieh et al. |
| 6,580,123 B2 | 6/2003 | Thapar |
| 6,580,154 B2 | 6/2003 | Noble et al. |
| 6,621,107 B2 | 9/2003 | Blanchard et al. |
| 6,642,109 B2 | 11/2003 | Lee et al. |
| 6,661,054 B1 | 12/2003 | Nakamura |
| 6,683,346 B2 | 1/2004 | Zeng |
| 6,700,158 B1 | 3/2004 | Cao et al. |
| 6,707,128 B2 | 3/2004 | Moriguchi et al. |
| 6,710,403 B2 | 3/2004 | Sapp |
| 6,717,210 B2 | 4/2004 | Takano et al. |
| 6,756,274 B2 | 6/2004 | Williams et al. |
| 6,764,889 B2 | 7/2004 | Baliga |
| 6,770,539 B2 | 8/2004 | Sumida |
| 6,781,199 B2 | 8/2004 | Takahashi |
| 6,825,105 B2 | 11/2004 | Grover et al. |
| 6,838,722 B2 | 1/2005 | Bhalla et al. |

(56) References Cited

U.S. PATENT DOCUMENTS

| | | |
|---|---|---|
| 6,861,701 B2 | 3/2005 | Williams et al. |
| 6,882,000 B2 | 4/2005 | Darwish et al. |
| 6,900,100 B2 | 5/2005 | Williams et al. |
| 6,903,393 B2 | 6/2005 | Ohmi et al. |
| 6,906,380 B1 | 6/2005 | Pattanayak et al. |
| 6,919,610 B2 | 7/2005 | Saitoh et al. |
| 6,921,697 B2 | 7/2005 | Darwish et al. |
| 6,927,455 B2 | 8/2005 | Narazaki |
| 6,960,821 B2 | 11/2005 | Noble et al. |
| 6,987,305 B2 | 1/2006 | He et al. |
| 7,005,347 B1 | 2/2006 | Bhalla et al. |
| 7,009,247 B2 | 3/2006 | Darwish |
| 7,141,860 B2 | 11/2006 | Khemka et al. |
| 7,224,022 B2 | 5/2007 | Tokano et al. |
| 7,335,946 B1 | 2/2008 | Bhalla et al. |
| 7,345,342 B2 | 3/2008 | Challa et al. |
| 7,361,952 B2 | 4/2008 | Miura et al. |
| 7,375,029 B2 | 5/2008 | Poelzl |
| 7,385,248 B2 | 6/2008 | Herrick et al. |
| 7,393,749 B2 | 7/2008 | Yilmaz et al. |
| 7,397,083 B2 | 7/2008 | Amali et al. |
| 7,449,354 B2 | 11/2008 | Marchant et al. |
| 7,494,876 B1 | 2/2009 | Giles et al. |
| 7,504,303 B2 | 3/2009 | Yilmaz et al. |
| 7,521,306 B2 | 4/2009 | Kubo et al. |
| 7,541,642 B2 | 6/2009 | Kawamura et al. |
| 7,544,568 B2 | 6/2009 | Matsuura et al. |
| 7,544,571 B2 | 6/2009 | Park |
| 7,554,152 B1 | 6/2009 | Ranucci et al. |
| 7,582,531 B2 | 9/2009 | Siemieniec et al. |
| 7,598,143 B2 | 10/2009 | Zundel et al. |
| 7,652,325 B2 | 1/2010 | Siemieniec et al. |
| 7,663,195 B2 | 2/2010 | Ohmi et al. |
| RE41,509 E | 8/2010 | Kinzer et al. |
| 7,868,381 B1 | 1/2011 | Bhalla et al. |
| 7,910,440 B2 | 3/2011 | Ohta et al. |
| 7,910,486 B2 | 3/2011 | Yilmaz et al. |
| 7,936,009 B2 | 5/2011 | Pan et al. |
| 7,964,913 B2 | 6/2011 | Darwish |
| 8,008,970 B1 | 8/2011 | Homol et al. |
| 8,013,391 B2 | 9/2011 | Yedinak et al. |
| 8,080,459 B2 | 12/2011 | Xu |
| 8,168,480 B2 | 5/2012 | Lin et al. |
| 8,203,181 B2 | 6/2012 | Hirler |
| 8,247,865 B2 | 8/2012 | Hirler |
| 8,367,500 B1 | 2/2013 | Xu et al. |
| 8,373,449 B2 | 2/2013 | Thiele et al. |
| 8,497,549 B2 | 7/2013 | Madson |
| 8,502,274 B1 | 8/2013 | Matoy et al. |
| 8,507,978 B2 | 8/2013 | Bhalla et al. |
| 8,518,777 B2 | 8/2013 | Shenoy |
| 8,541,837 B2 | 9/2013 | Hirler |
| 8,618,598 B2 | 12/2013 | Haeberlen et al. |
| 8,629,019 B2 | 1/2014 | Xu et al. |
| 8,629,505 B2 | 1/2014 | Nishiwaki |
| 8,686,493 B2 | 4/2014 | Thorup et al. |
| 9,202,909 B2 | 12/2015 | Haeberlen et al. |
| 9,257,549 B2 | 2/2016 | Hirler |
| 9,461,639 B2 | 10/2016 | Franchini et al. |
| 9,577,089 B2 | 2/2017 | Terrill et al. |
| 2001/0026006 A1 | 10/2001 | Noble et al. |
| 2001/0026989 A1 | 10/2001 | Thapar |
| 2002/0036319 A1 | 3/2002 | Baliga |
| 2002/0038887 A1 | 4/2002 | Ninomiya et al. |
| 2002/0050847 A1 | 5/2002 | Taniguchi et al. |
| 2002/0056884 A1 | 5/2002 | Baliga |
| 2002/0074585 A1 | 6/2002 | Tsang et al. |
| 2002/0123196 A1 | 9/2002 | Chang et al. |
| 2002/0130359 A1 | 9/2002 | Okumura et al. |
| 2003/0030092 A1 | 2/2003 | Darwish et al. |
| 2003/0086296 A1 | 5/2003 | Wu et al. |
| 2003/0178676 A1 | 9/2003 | Henninger et al. |
| 2003/0201483 A1 | 10/2003 | Sumida |
| 2003/0201502 A1 | 10/2003 | Hsieh |
| 2004/0016959 A1 | 1/2004 | Yamaguchi et al. |
| 2004/0021173 A1 | 2/2004 | Sapp |
| 2004/0021174 A1 | 2/2004 | Kobayashi |
| 2004/0038479 A1 | 2/2004 | Hsieh |
| 2004/0084721 A1 | 5/2004 | Kocon et al. |
| 2004/0113202 A1 | 6/2004 | Kocon et al. |
| 2004/0155287 A1 | 8/2004 | Omura et al. |
| 2004/0161886 A1 | 8/2004 | Forbes et al. |
| 2004/0173844 A1 | 9/2004 | Williams et al. |
| 2005/0001268 A1 | 1/2005 | Baliga |
| 2005/0026369 A1 | 2/2005 | Noble et al. |
| 2005/0029585 A1 | 2/2005 | He et al. |
| 2005/0079676 A1 | 4/2005 | Mo et al. |
| 2005/0079678 A1 | 4/2005 | Verma et al. |
| 2005/0082591 A1 | 4/2005 | Hirler et al. |
| 2005/0151190 A1 | 7/2005 | Kotek et al. |
| 2005/0167695 A1 | 8/2005 | Yilmaz |
| 2005/0167742 A1 * | 8/2005 | Challa ............... H01L 21/3065 257/328 |
| 2005/0174823 A1 | 8/2005 | Cao et al. |
| 2005/0184336 A1 | 8/2005 | Takahashi et al. |
| 2005/0231177 A1 | 10/2005 | Tateno et al. |
| 2005/0266642 A1 | 12/2005 | Kubo et al. |
| 2006/0014349 A1 | 1/2006 | Williams et al. |
| 2006/0017056 A1 | 1/2006 | Hirler |
| 2006/0108635 A1 | 5/2006 | Bhalla et al. |
| 2006/0113577 A1 | 6/2006 | Ohtani |
| 2006/0113588 A1 | 6/2006 | Wu |
| 2006/0209887 A1 | 9/2006 | Bhalla et al. |
| 2006/0214221 A1 | 9/2006 | Challa et al. |
| 2006/0226494 A1 | 10/2006 | Hshieh |
| 2006/0267090 A1 | 11/2006 | Sapp et al. |
| 2006/0273383 A1 | 12/2006 | Hshieh |
| 2006/0273386 A1 | 12/2006 | Yilmaz et al. |
| 2006/0281249 A1 | 12/2006 | Yilmaz et al. |
| 2006/0285368 A1 | 12/2006 | Schlecht |
| 2007/0004116 A1 | 1/2007 | Hshieh |
| 2007/0007589 A1 | 1/2007 | Nakagawa |
| 2007/0013000 A1 | 1/2007 | Shiraishi |
| 2007/0023828 A1 | 2/2007 | Kawamura et al. |
| 2007/0037327 A1 | 2/2007 | Herrick et al. |
| 2007/0108511 A1 | 5/2007 | Hirler |
| 2007/0108515 A1 | 5/2007 | Hueting et al. |
| 2007/0132014 A1 | 6/2007 | Hueting |
| 2007/0138546 A1 | 6/2007 | Kawamura et al. |
| 2007/0145411 A1 * | 6/2007 | Chen ............... H01L 27/0629 257/173 |
| 2007/0155104 A1 | 7/2007 | Marchant et al. |
| 2007/0221952 A1 | 9/2007 | Thorup et al. |
| 2007/0228496 A1 | 10/2007 | Rochefort et al. |
| 2007/0249142 A1 | 10/2007 | Hisanaga |
| 2008/0073707 A1 | 3/2008 | Darwish |
| 2008/0076222 A1 | 3/2008 | Zundel et al. |
| 2008/0099344 A9 | 5/2008 | Basol et al. |
| 2008/0135889 A1 | 6/2008 | Session |
| 2008/0135931 A1 | 6/2008 | Challa |
| 2008/0164515 A1 | 7/2008 | Li |
| 2008/0164517 A1 | 7/2008 | Ohta et al. |
| 2008/0166845 A1 | 7/2008 | Darwish |
| 2008/0173969 A1 | 7/2008 | Hebert et al. |
| 2008/0197406 A1 | 8/2008 | Parthasarathy et al. |
| 2008/0197407 A1 | 8/2008 | Challa et al. |
| 2008/0199997 A1 | 8/2008 | Grebs et al. |
| 2008/0230833 A1 | 9/2008 | Zundel et al. |
| 2008/0246081 A1 | 10/2008 | Li et al. |
| 2008/0265289 A1 | 10/2008 | Bhalla et al. |
| 2008/0296668 A1 | 12/2008 | Von Borcke |
| 2008/0315886 A1 | 12/2008 | Ghallab et al. |
| 2009/0035900 A1 | 2/2009 | Thorup et al. |
| 2009/0050959 A1 | 2/2009 | Madson |
| 2009/0057756 A1 | 3/2009 | Hshieh |
| 2009/0072301 A1 | 3/2009 | Bhalla et al. |
| 2009/0140327 A1 | 6/2009 | Hirao et al. |
| 2009/0159963 A1 | 6/2009 | Yamaguchi et al. |
| 2009/0162989 A1 | 6/2009 | Cho et al. |
| 2009/0166740 A1 | 7/2009 | Bhalla et al. |
| 2009/0189219 A1 | 7/2009 | Shinbori et al. |
| 2009/0246923 A1 | 10/2009 | Park |
| 2009/0250770 A1 | 10/2009 | Su et al. |
| 2009/0273026 A1 | 11/2009 | Wilson et al. |

(56) References Cited

U.S. PATENT DOCUMENTS

| | | |
|---|---|---|
| 2010/0006928 A1 | 1/2010 | Pan et al. |
| 2010/0055892 A1 | 3/2010 | Poelzl |
| 2010/0059797 A1 | 3/2010 | Ngai et al. |
| 2010/0078718 A1 | 4/2010 | Blank et al. |
| 2010/0134150 A1 | 6/2010 | Park et al. |
| 2010/0181606 A1 | 7/2010 | Takaishi |
| 2010/0207206 A1* | 8/2010 | Krischke ............ H01L 29/0642 257/337 |
| 2010/0314693 A1 | 12/2010 | Su et al. |
| 2010/0320461 A1 | 12/2010 | Su et al. |
| 2011/0049614 A1 | 3/2011 | Gao et al. |
| 2011/0053326 A1 | 3/2011 | Gao et al. |
| 2011/0079843 A1 | 4/2011 | Darwish et al. |
| 2011/0089485 A1 | 4/2011 | Gao et al. |
| 2011/0089486 A1 | 4/2011 | Xu et al. |
| 2011/0227069 A1* | 9/2011 | Hashimoto ....... H01L 23/49562 257/48 |
| 2012/0012929 A1 | 1/2012 | Saito et al. |
| 2012/0043602 A1 | 2/2012 | Zeng et al. |
| 2012/0061753 A1 | 3/2012 | Nishiwaki |
| 2012/0187474 A1 | 7/2012 | Rexer et al. |
| 2012/0220092 A1 | 8/2012 | Bobde et al. |
| 2012/0267704 A1 | 10/2012 | Siemieniec et al. |
| 2012/0313161 A1 | 12/2012 | Grivna et al. |
| 2012/0326229 A1 | 12/2012 | Poelzl et al. |
| 2013/0049072 A1 | 2/2013 | Heineck et al. |
| 2013/0057241 A1 | 3/2013 | Shuvalov |
| 2013/0115745 A1 | 5/2013 | Chung |
| 2013/0214348 A1 | 8/2013 | Takeda |
| 2013/0221436 A1 | 8/2013 | Hossain et al. |
| 2013/0248991 A1 | 9/2013 | Yilmaz et al. |
| 2014/0070313 A1 | 3/2014 | Wang et al. |
| 2014/0206165 A1 | 7/2014 | Li et al. |
| 2014/0209905 A1 | 7/2014 | Meiser |
| 2014/0217495 A1 | 8/2014 | Wutte et al. |
| 2014/0264567 A1 | 9/2014 | Challa |
| 2015/0061643 A1 | 3/2015 | Aerts |
| 2015/0108568 A1 | 4/2015 | Terrill et al. |
| 2015/0115985 A1 | 4/2015 | Gambetta |
| 2015/0333060 A1 | 11/2015 | Decker et al. |
| 2016/0056138 A1 | 2/2016 | Shibib et al. |
| 2017/0299639 A1 | 10/2017 | Shibib et al. |

FOREIGN PATENT DOCUMENTS

| | | |
|---|---|---|
| DE | 4208695 | 9/1992 |
| DE | 102004036330 | 3/2005 |
| DE | 102005041322 | 3/2007 |
| DE | 102006007096 | 8/2007 |
| DE | 112005003584 | 4/2008 |
| EP | 0133642 | 3/1985 |
| EP | 0354449 | 2/1990 |
| EP | 0438700 | 7/1991 |
| EP | 0583022 | 2/1994 |
| EP | 0583028 | 2/1994 |
| EP | 0620588 | 10/1994 |
| EP | 0628337 | 12/1994 |
| EP | 0746030 | 12/1994 |
| EP | 0717450 | 6/1996 |
| EP | 1033759 | 9/2000 |
| EP | 1186023 | 3/2002 |
| EP | 1351313 | 10/2003 |
| EP | 1376674 | 1/2004 |
| EP | 1403914 | 3/2004 |
| GB | 2269050 | 1/1994 |
| JP | 62298152 | 12/1987 |
| JP | S63296282 | 2/1988 |
| JP | H03211885 | 1/1990 |
| JP | H03173180 | 7/1991 |
| JP | 03211885 | 9/1991 |
| JP | H05315620 | 11/1993 |
| JP | H06350090 | 12/1994 |
| JP | H07045817 | 2/1995 |
| JP | H07235676 | 9/1995 |
| JP | H08167711 | 6/1996 |
| JP | 08250731 | 9/1996 |
| JP | H09129877 | 5/1997 |
| JP | H09191103 | 7/1997 |
| JP | H109260645 | 10/1997 |
| JP | H110032331 | 2/1998 |
| JP | H10173175 | 6/1998 |
| JP | H10214809 | 8/1998 |
| JP | H110214809 | 8/1998 |
| JP | H1117179 | 1/1999 |
| JP | H11068102 | 3/1999 |
| JP | 2000191344 | 3/2000 |
| JP | 2000223705 | 8/2000 |
| JP | 2000332246 | 11/2000 |
| JP | 2001016080 | 1/2001 |
| JP | 2001308327 | 11/2001 |
| JP | 2002016080 | 1/2002 |
| JP | 2002110978 | 4/2002 |
| JP | 2002110984 | 4/2002 |
| JP | 2002134705 | 5/2002 |
| JP | 2002190593 | 7/2002 |
| JP | 2002222950 | 8/2002 |
| JP | 2002246596 | 8/2002 |
| JP | 2002368221 | 12/2002 |
| JP | 2002373988 | 12/2002 |
| JP | 2003030396 | 1/2003 |
| JP | 2003515954 | 5/2003 |
| JP | 2003282870 | 10/2003 |
| JP | 2003309263 | 10/2003 |
| JP | 2003324196 | 11/2003 |
| JP | 2004522319 | 7/2004 |
| JP | 2004241413 | 8/2004 |
| JP | 2005032941 | 2/2005 |
| JP | 2005057050 | 3/2005 |
| JP | 2005142240 | 6/2005 |
| JP | 2005191221 | 7/2005 |
| JP | 2005524970 | 8/2005 |
| JP | 2005268679 | 9/2005 |
| JP | 2006202931 | 8/2006 |
| JP | 2006339558 | 12/2006 |
| JP | 2007027561 | 2/2007 |
| JP | 2007158275 | 6/2007 |
| JP | 2007189192 | 7/2007 |
| JP | 2007529115 | 10/2007 |
| JP | 2008042056 | 2/2008 |
| JP | 2008511982 | 4/2008 |
| JP | 2008171887 | 7/2008 |
| JP | 2008543046 | 11/2008 |
| JP | 2008546189 | 12/2008 |
| JP | 2008546216 | 12/2008 |
| JP | 2009004411 | 1/2009 |
| JP | 2009043966 | 2/2009 |
| JP | 2009505403 | 2/2009 |
| JP | 2009141005 | 6/2009 |
| JP | 2009522807 | 6/2009 |
| JP | 2009542002 | 11/2009 |
| JP | 2010505270 | 2/2010 |
| JP | 2011258834 | 12/2011 |
| JP | 2012023272 | 2/2012 |
| JP | 2012059943 | 3/2012 |
| JP | 2012199385 | 10/2012 |
| JP | 2012216675 | 11/2012 |
| JP | 2013508980 | 3/2013 |
| JP | 2013171931 | 9/2013 |
| TW | 490853 | 6/2002 |
| TW | I302028 | 10/2008 |
| WO | 9403922 | 2/1994 |
| WO | 200025363 | 5/2000 |
| WO | 200025365 | 5/2000 |
| WO | 2000042665 | 7/2000 |
| WO | 0065646 | 11/2000 |
| WO | 200065646 | 11/2000 |
| WO | 0141206 | 6/2001 |
| WO | 0199177 | 12/2001 |
| WO | 03010812 | 2/2003 |
| WO | 200105116 | 12/2004 |
| WO | 2005065385 | 7/2005 |
| WO | 2006025035 | 3/2006 |
| WO | 2006058210 | 6/2006 |

(56) References Cited

FOREIGN PATENT DOCUMENTS

| WO | 2006126998 | 11/2006 |
|---|---|---|
| WO | 2006127914 | 11/2006 |
| WO | 2007002857 | 1/2007 |
| WO | 2007021701 | 2/2007 |
| WO | 2007129261 | 11/2007 |
| WO | 2008156071 | 12/2008 |
| WO | 2009026174 | 2/2009 |
| WO | 2011050115 | 4/2011 |
| WO | 2014091545 | 6/2014 |

OTHER PUBLICATIONS

Hattori, et al.; Design of a 200V Super Junction MOSFET with N-Buffer Regions and its Fabrication by Trench Filling; Proceedings of 2004 International Symposium on Power Semiconductor Devices & ICS, Kitakyushu; 2004.

L. Parechanian-Allen et al., "Device Quality Growth and Characterization of (110) GaAs Grown by Molecular Beam Epitaxy", submitted to Applied Physics Letters, Nov. 1986, Lawrence Berkeley Laboratory University of California, Berkeley, California, LBL-22564.

L. Parechanian-Allen et al., "Surface Faceting of (110) GaAs: Analysis and Elimination", presented at the Material Research Society Fall Conference, Session I, Boston, MA, Dec. 1, 1986, Lawrence Berkeley Laboratory Jniversity of California, Berkeley, California, LBL-22577.

Masakatsu Hoshi et al., "A DMOSFET Having a Cell Array Field Ring for Improving Avalanche Capability", May 18, 1993, IEEE, Proceedings of the 5th International Symposium on Power Semiconductor Devices and ICs (ISPSD), Monterey, California, May 18-20, 1993, pp. 141-145, XP000380145.

Y. C. Pao et al., "(110)-Oriented GaAs MESFET's", IEEE Electron Device Letters, vol. 9, No. 3, pp. 119-121, Mar. 1988.

Furukawa et al., "Low On-Resistance 1.2kV 4H-SiC MOSFETs Integrated with Current Sensor," Proceedings of the 23rd International Symposium on Power Semiconductor Devices & IC's, pp. 288-291, May 23-26, 2011.

Baba, Y. et al., "High Reliable UMOSFET with Oxide-nitride Complex Gate Structure", IEEE, May 26, 1997, pp. 369-372.

Hsu et al., "A Novel Trench Termination Design for 100-V TMBS Diode Application", IEEE Electron Device Letters, vol. 22, No. 11, Nov. 2001, pp. 551-552.

Imai; K. et al., "Decrease in Trenched Surface Oxide Leakage Currents by Rounding Off Oxidation", Extended Abstracts of the 18th (1986 International) Conference on Solid State Devices and Materials, Tokyo, Aug. 20, 1986, pp. 303-306.

Initial Publication with ISR, dated Nov. 7, 2013, International application No. PCT/US2013/038956, Korean Intellectual Property Office, Republic of Korea.

Initial Publication with ISR, dated Nov. 7, 2013, International application No. PCT/US2013/038957, Korean Intellectual Property Office, Republic of Korea.

Effects on Selecting Channel Direction in Improving Performance of Sub-100 nm MOSFETs Fabricated on (110) Surface Si Substrate Japanese Journal of Applied Physics, Part 1, vol. 43, No. 4B, Apr. 2004 pp. 1723-1728 (Nakamura et al.), XP00122768.

Sugi et al,; ("A 30V Class Extremely Low On-Resistance Meshed Trench Lateral Power MOSFET." IEEE IEDM Technical Digest, pp. 297-300, Sep. 2002) (Year: 2002).

\* cited by examiner (section AA)

(section BB)

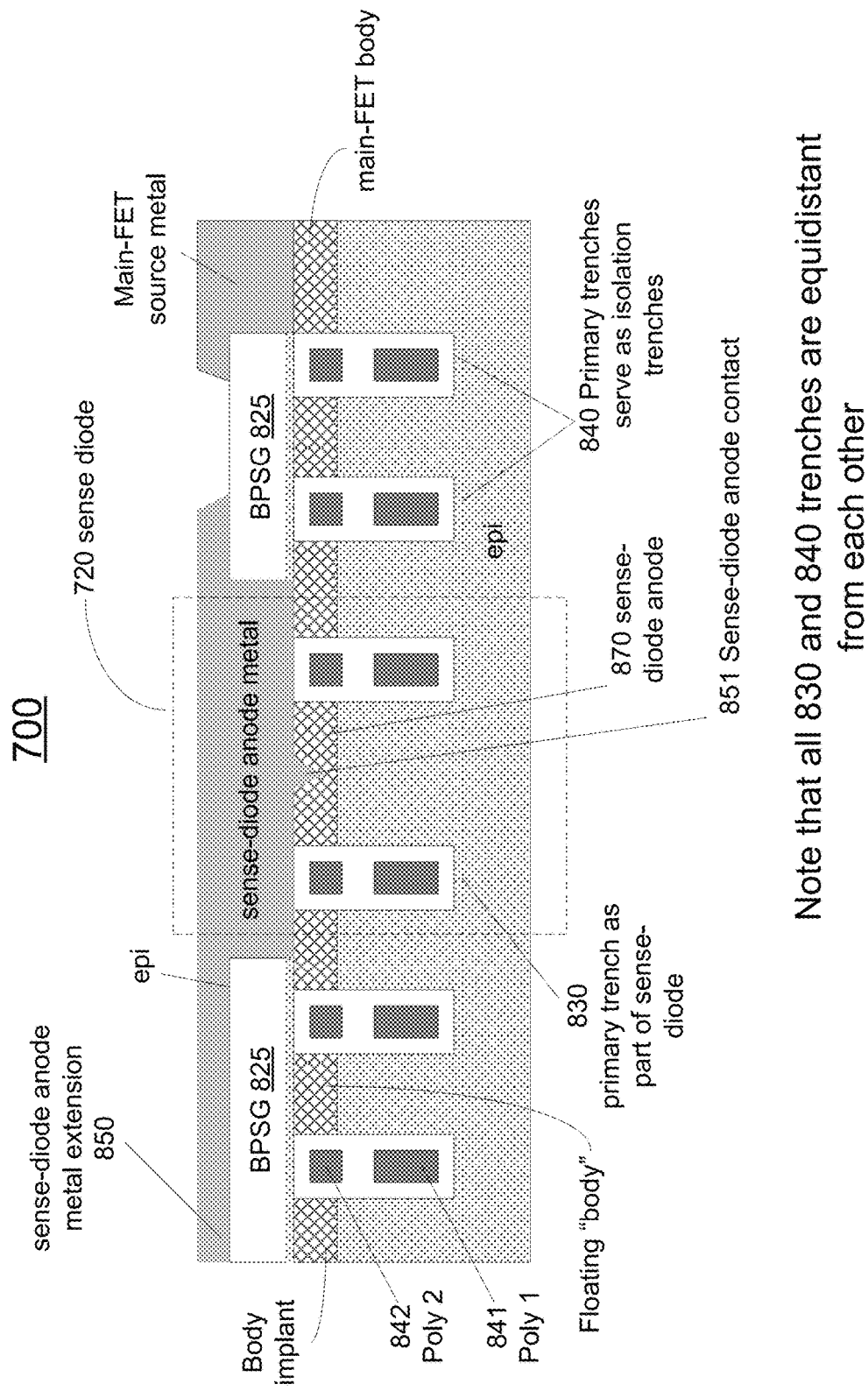

VERTICAL SENSE DEVICES IN VERTICAL TRENCH MOSFET

RELATED APPLICATIONS

This Application is a Divisional application of U.S. patent application Ser. No. 14/830,324, filed Aug. 19, 2015, entitled "Vertical Sense Devices in Vertical Trench MOSFET," to Shibib and Zhang, which in turn claimed priority to U.S. Provisional Patent Application No. 62/039,335, filed Aug. 19, 2014, entitled, "High Ratio Current Sense MOSFET structure in a Charge Balanced Split Gate Trench Technology" to Shibib and Zhang. All such applications are hereby incorporated herein by reference in their entireties.

This Application is related to co-pending, commonly owned U.S. application Ser. No. 13/460,567, filed Apr. 20, 2012, to Bobde et al., entitled "Hybrid Split Gate Semiconductor," which is hereby incorporated herein by reference in its entirety.

FIELD OF INVENTION

Embodiments of the present invention relate to the field of integrated circuit design and manufacture. More specifically, embodiments of the present invention relate to systems and methods for vertical sense devices in vertical trench MOSFETs.

BACKGROUND

Measuring current in a power supply is an important consideration in the design and implementation of modern power supplies. A current sense function may be used for fault detection and/or protection, for current-mode controlled voltage regulation, and for current control, among other uses. Over the years, a variety of systems have been used to measure current in a power supply, including, for example, discrete resistors, use of a resistance inherent to traces of printed circuit boards, use of resistance inherent to an integrated circuit lead frame, use of inductors, magnetic sensing devices including coils, transformers and Hall effect sensors, and use of a drain-source resistance of a power metal oxide semiconductor field effect transistor (MOSFET).

One of the leading systems to measure current in a power supply uses a dedicated field effect transistor (FET) known as or referred to as a "sense-FET." Generally, a sense-FET is small a FET, separate from the main power FET, referred to herein as the "main-FET." Generally, a sense-FET is configured to produce a voltage corresponding to the current in the main-FET. The "current sense ratio" (CSR) is a figure of merit of the implementation of the sense-FET. The current sense ratio is a ratio of current in the main-FET to current in the sense-FET, e.g., Imain/Isense. A higher current sense ratio is generally desirable, so that the range of current sensing is extended over many decades of current in the main-FET. However, increasing CSR has been a challenge due to, for example, complex interactions between sense-FET structures and main-FET structures.

Conventional approaches to design and implementation of sense-FETs have not been found to be applicable to Split Gate Charge Balanced (SGCB) trench MOSFETs. A split gate device includes multiple layers of polysilicon in the trenches with different electrical voltages, and it has a special structure and layout to establish the proper charge balance. For example, the trenches are spaced a certain distance apart to establish a charge balance, and furthermore, any active body junction in the device must be properly surrounded by polysilicon shields that establish the charge balance.

SUMMARY OF THE INVENTION

Therefore, what is needed are systems and methods for vertical sense devices in vertical trench metal oxide semiconductor field effect transistors (MOSFETs). An additional need exists for systems and methods for vertical sense devices in vertical trench MOSFETs that are integral to the main-FET. What is further needed are systems and methods for current sense MOSFETs in vertical trench MOSFETs including an isolation region between the sense-FET and the main-FET that preserves charge balance in the main-FET. A yet further need exists for a sensing diode to sense temperature and/or gate voltage of the main-FET. A still further need exists for systems and methods for vertical sense devices in vertical trench MOSFETs that are compatible and complementary with existing systems and methods of integrated circuit design, manufacturing and test. Embodiments of the present invention provide these advantages.

In accordance with an embodiment of the present invention, an electronic circuit includes a vertical trench metal oxide semiconductor field effect transistor configured for controlling currents of at least one amp and a current sensing field effect transistor configured to provide an indication of drain to source current of the MOSFET. In some embodiments, a current sense ratio of the current sensing FET is at least 15 thousand and may be greater than 29 thousand.

In accordance with another embodiment of the present invention, a power semiconductor device includes a main vertical trench metal oxide semiconductor field effect transistor (main-MOSFET). The main-MOSFET includes a plurality of parallel main trenches, wherein the main trenches include a first electrode coupled to a gate of the main-MOSFET and a plurality of main mesas between the main trenches, wherein the main mesas include a main source and a main body of the main-MOSFET. The power semiconductor device also includes a current sense field effect transistor (sense-FET). The sense-FET includes a plurality of sense-FET trenches, wherein each of the sense-FET trenches includes a portion of one of the main trenches and a plurality of source-FET mesas between the source-FET trenches, wherein the source-FET mesas include a sense-FET source that is electrically isolated from the main source of the main-MOSFET.

In accordance with a further embodiment of the present invention, a semiconductor device includes a main-FET including a main-FET source region and a current sensing FET (sense-FET) configured to produce a voltage corresponding to a drain source current of a the main-FET. A gate and a drain of the sense-FET are coupled to a gate and a drain of the main-FET. The sense-FET includes a plurality of first trenches formed in a first horizontal dimension configured to isolate a sense-FET source region from the main-FET source region. Each of the trenches includes multiple alternating layers of conductors and dielectrics in a vertical dimension. The semiconductor device further includes at least one second trench in a perpendicular horizontal dimension located between the sense-FET source region and the main-FET source region and configured to isolate the sense-FET source region from the main-FET source region, and a buffer region separating sense-FET source region and the main-FET source region.

In accordance with still another embodiment of the present invention, a power semiconductor device includes a vertical trench main MOSFET (main-FET) configured to control a drain source current, a vertical trench current sensing FET (sense-FET) configured to produce a voltage corresponding to the drain source current, and an isolation trench configured to isolate the main-FET from the sense-FET. The isolation trench is formed at an angle to, and intersects a plurality of trenches of the main-FET.

In a still further embodiment in accordance with the present invention, a power semiconductor device includes a substrate and a split gate vertical trench main MOSFET (main-FET), formed in the substrate, configured to control a drain source current. The main-FET includes a main-FET source metal, disposed on the surface of the substrate, configured to couple a plurality of main-FET source regions to one another and to a plurality of main-FET source terminals. The power semiconductor device also includes a vertical trench current sensing FET (sense-FET), formed in the substrate, configured to produce a voltage corresponding to the drain source current. The sense-FET is surrounded on at least three sides by the main-FET source metal. The substrate may include epitaxially grown material.

In a still further yet embodiment in accordance with the present invention, a power semiconductor device includes a substrate and a split gate vertical trench main MOSFET (main-FET), formed in the substrate, configured to control a drain source current. The power semiconductor device also includes a vertical trench current sensing FET (sense-FET), formed in the substrate, configured to produce a voltage corresponding to the drain source current. The sense-FET and the main-FET include common gate and drain terminals. The sense-FET may include portions of trenches forming the main-FET. The substrate may include epitaxially grown material.

In yet another embodiment in accordance with the present invention, a semiconductor device includes a main vertical trench metal oxide semiconductor field effect transistor (main-MOSFET). The main-MOSFET includes a plurality of parallel main trenches, wherein the main trenches comprise a first electrode coupled to a gate of the main-MOSFET, and a plurality of main mesas between the main trenches, wherein the main mesas comprise a main source and a main body of the main-MOSFET. The semiconductor device also includes a sense-diode. The sense-diode includes a plurality of sense-diode trenches, wherein each of the sense-diode trenches comprises a portion of one of the main trenches, and a plurality of sense-diode mesas between the source-FET trenches, wherein the sense-diode mesas comprise a sense-diode anode that is electrically isolated from the main source of the main-MOSFET.

In a still yet further embodiment in accordance with the present invention, a semiconductor device includes a vertical trench main MOSFET (main-FET) configured to control a drain source current, a vertical trench sense-diode (sense-diode) configured to produce a signal corresponding to a temperature of the main-FET, and an isolation trench configured to isolate the main-FET from the sense-diode. The isolation trench is formed at an angle to, and intersects a plurality of trenches of the main-FET.

In accordance with a still further yet embodiment of the present invention, a semiconductor device includes a main-FET comprising a main-FET source region and a sense-diode configured to produce a signal corresponding to a temperature of the main-FET. The sense-diode includes a plurality of first trenches formed in a first horizontal dimension configured to isolate a sense-diode anode region from the main-FET source region. Each of the trenches comprises multiple alternating layers of conductors and dielectrics in a vertical dimension. The semiconductor device also includes at least one second trench in a perpendicular horizontal dimension located between the sense-diode anode region and the main-FET source region and configured to isolate the sense-diode anode region from the main-FET source region and a buffer region separating the sense-diode anode region and the main-FET source region.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

FIG. 8 illustrates an exemplary cross-sectional view of a portion of power semiconductor device, in accordance with embodiments of the present invention.

DETAILED DESCRIPTION

Figure 1A:
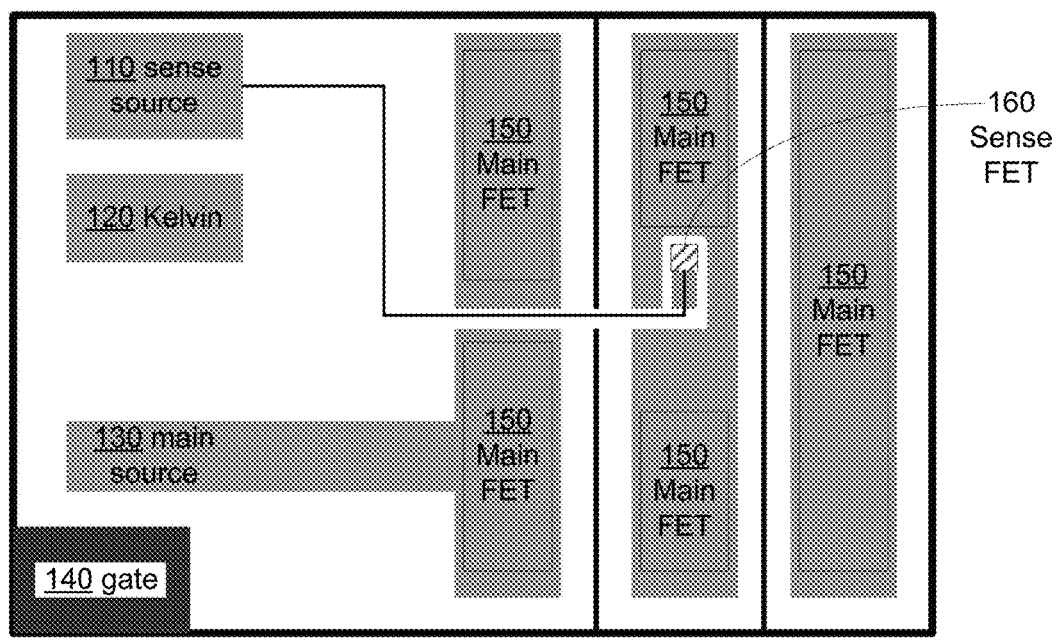
FIG. 1A illustrates a plan view of an exemplary current sense MOSFET in a power semiconductor device, in accordance with embodiments of the present invention.

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Notation and Nomenclature

The figures are not drawn to scale, and only portions of the structures, as well as the various layers that form those structures, may be shown in the figures. Furthermore, fabrication processes and operations may be performed along with the processes and operations discussed herein; that is, there may be a number of process operations before, in between and/or after the operations shown and described herein. Importantly, embodiments in accordance with the present invention can be implemented in conjunction with these other (perhaps conventional) processes and operations without significantly perturbing them. Generally speaking, embodiments in accordance with the present invention may replace and/or supplement portions of a conventional process without significantly affecting peripheral processes and operations.

The term "MOSFET" is generally understood to be synonymous with the term insulated-gate field-effect transistor (IGFET), as many modern MOSFETs comprise a non-metal gate and/or a non-oxide gate insulator. As used herein, the term "MOSFET" does not necessarily imply or require FETs that include metal gates and/or oxide gate insulators. Rather, the term "MOSFET" includes devices commonly known as or referred to as MOSFETs.

As used herein, the letter "n" refers to an n-type dopant and the letter "p" refers to a p-type dopant. A plus sign "+" or a minus sign "−" is used to represent, respectively, a relatively high or relatively low concentration of such dopant(s).

The term "channel" is used herein in the accepted manner. That is, current moves within a FET in a channel, from the source connection to the drain connection. A channel can be made of either n-type or p-type semiconductor material; accordingly, a FET is specified as either an n-channel or p-channel device. Some of the figures are discussed in the context of an n-channel device, more specifically an n-channel vertical MOSFET; however, embodiments according to the present invention are not so limited. That is, the features described herein may be utilized in a p-channel device. The discussion of an n-channel device can be readily mapped to a p-channel device by substituting p-type dopant and materials for corresponding n-type dopant and materials, and vice versa.

The term "trench" has acquired two different, but related meanings within the semiconductor arts. Generally, when referring to a process, e.g., etching, the term trench is used to mean or refer to a void of material, e.g., a hole or ditch. Generally, the length of such a hole is much greater than its width or depth. However, when referring to a semiconductor structure or device, the term trench is used to mean or refer to a solid vertically-aligned structure, disposed beneath a primary surface of a substrate, having a complex composition, different from that of the substrate, and usually adjacent to a channel of a field effect transistor (FET). The structure comprises, for example, a gate of the FET. Accordingly, a trench semiconductor device generally comprises a mesa structure, which is not a trench, and portions, e.g., one half, of two adjacent structural "trenches."

It is to be appreciated that although the semiconductor structure commonly referred to as a "trench" may be formed by etching a trench and then filling the trench, the use of the structural term herein in regards to embodiments of the present invention does not imply, and is not limited to such processes.

Vertical Sense Devices in Vertical Trench Mosfet

A charge balanced split gate vertical trench metal oxide semiconductor field effect transistor (MOSFET) generally comprises trenches that extend into one or more epitaxial layers that are grown on top of a heavily doped substrate. The trenches are etched deep enough, typically a few micrometers, to be able to contain several layers of oxide and polysilicon. The lower layer of the polysilicon ("poly 1"), which is closest to the trench bottom, is usually tied to the source electrical potential and is an essential part of establishing the charge balance condition that results in a desirable low "on" resistance for a given breakdown voltage. The upper layer of the polysilicon ("poly 2") is usually used as the gate of the device. Both layers are well inside the trench and separated from the epitaxial regions by different thicknesses of dielectric layers, for example, silicon dioxide.

In accordance with embodiments of the present invention, a relatively small sense-FET is established proximate the top body of a relatively larger split gate MOSFET, known as the "main-FET." A sense-FET should be able to deliver a current in the sense-FET that is a small fraction of the current passing through the main-FET. For example, the sense-FET should be characterized as having a large current sense ratio (CSR).

In general, a current sense ratio (CSR) may be a property of both device geometry and temperature. For example, temperature differences between a sense-FET and portions of a main-FET may deleteriously change a CSR during operation.

In accordance with embodiments of the present invention, a sense-FET may be positioned in an area of a main-FET where a sense-FET can sense a high temperature of the die. The sense-FET may be surrounded on at least three sides by portions of the main-FET. In accordance with embodiments of the present invention, multiple sense-FETs, e.g., sharing a common sense-FET source, may be positioned in a plurality of locations throughout a main-FET. Such multiple locations may improve current sensing corresponding to thermal distribution across a large die, for example.

FIG. 1A illustrates a plan view of an exemplary current sense MOSFET (sense-FET) 160 in a power semiconductor device 100, in accordance with embodiments of the present invention. A principal function of power semiconductor device 100 is to function as a power MOSFET, e.g., to control a drain source current through the power MOSFET. Power semiconductor device 100 comprises large areas of main-FET 150. For example, main-FET 150 comprises numerous trenches comprising gate and shield electrodes, and mesas in-between the trenches comprising source and body regions. The main-FET 150 comprises a gate coupled to a gate terminal 140, for example, a bond pad. The main-FET 150 comprises a source coupled to a main-FET source terminal 130. The drain of the main-FET 150 is outside, e.g., below, the plane of FIG. 1A.

Power semiconductor device 100 comprises a sense-FET 160, formed within a region of the main-FET 150, in accordance with embodiments of the present invention. It is appreciated that die area of main-FET 150 is very much greater than die area of sense-FET 160. The gate and drain of the sense-FET 160 are in common, e.g., in parallel, with the gate and drain of the main-FET 150. The source of the sense-FET 160 is coupled to a sense source terminal 110, e.g., a bond pad. The sense-FET outputs a voltage corresponding to current in the main-FET 150. The node Kelvin may be coupled to a terminal 120 for use off the die of power semiconductor device 100, in some embodiments. The voltage Kelvin may also, or alternatively, be used by circuitry (not shown) on the die of power semiconductor device 100, for example, to turn main-FET 150 off for over-current protection.

Figure 1B:
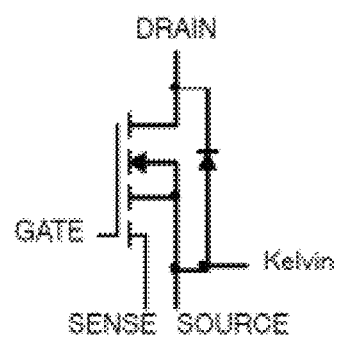
FIG. 1B illustrates an exemplary schematic symbol for a power semiconductor device, in accordance with embodiments of the present invention.

FIG. 1B illustrates an exemplary schematic symbol for power semiconductor device 100, in accordance with embodiments of the present invention.

Figure 2:
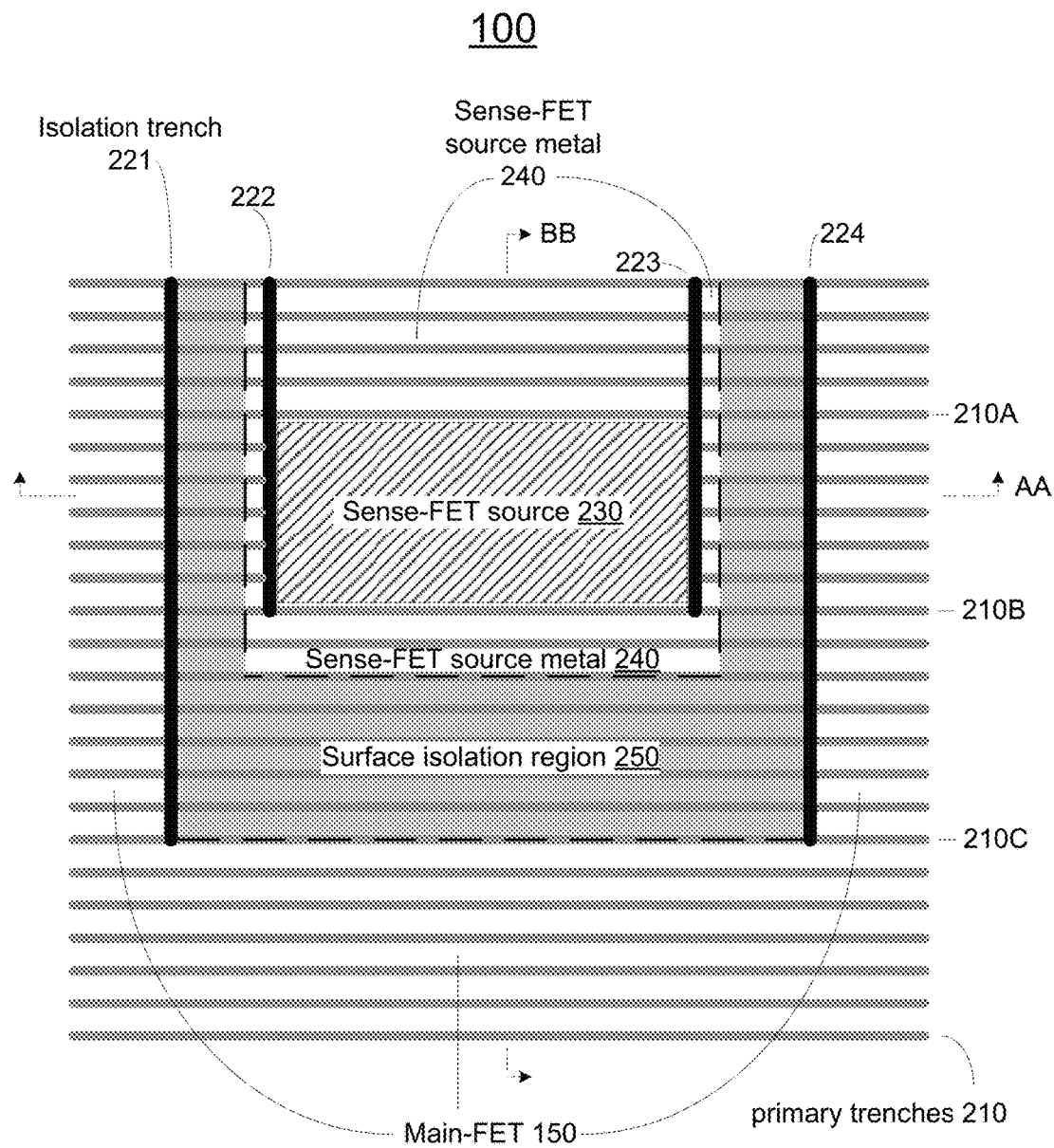
FIG. 2 illustrates an exemplary enlarged plan view of a portion of power semiconductor device, in accordance with embodiments of the present invention.

FIG. 2 illustrates an exemplary enlarged plan view of a portion of power semiconductor device 100 around and including sense-FET 160, in accordance with embodiments of the present invention. Power semiconductor device 100 comprises a plurality of primary trenches 210, illustrated horizontally in FIG. 2. The majority of primary trenches 210 are utilized by the main-FET 150.

Power semiconductor device 100 comprises four isolation trenches 221, 222, 223 and 224, in accordance with embodiments of the present invention. The isolation trenches 221-224 are part of a group of isolation structures to isolate sense-FET 160 from the main-FET 150. The isolation trenches 221-224 are perpendicular to the primary trenches 210, in accordance with embodiments of the present invention. Sense-FET 160 comprises a sense-FET source 230. Sense-FET source 230 is bounded by two isolation trenches, isolation trenches 222 and 223, and portions of two primary trenches 210, primary trenches 210A and 210B. Overlying and coupling sense-FET source 230 is sense-FET source metal 240. Sense-FET source metal 240 overlaps the isolation trenches 222 and 224. Sense-FET source metal 240 may extend off the top of the FIG. 2 for coupling to sense source terminal 110 (FIG. 1A), for example, in some embodiments. In accordance with other embodiments of the present invention, the source of main-FET 150 may be coupled in a different manner, e.g., out of the plane of FIG. 2. In such a case, the surface isolation region 250 would form a square annulus around the sense-FET 160 (FIG. 1), in accordance with embodiments of the present invention.

A surface isolation region 250 is formed outside of sense-FET 160, in accordance with embodiments of the present invention. In the exemplary embodiment of FIG. 2, surface isolation region 250 is generally "U" shaped. Surface isolation region 250 is formed between isolation trenches 221 and 222, between isolation trenches 223 and 224, and between primary trenches 210B and 210C. In general, portions of multiple primary trenches 220 should be used to isolate a sense-FET 160 from a main-FET 150, in order to maintain charge balance. P-type materials in the mesas of surface isolation region 250 are left floating. The surface of surface isolation region 250 may be covered with an insulator, for example, borophosphosilicate glass (BPSG).

Outside of surface isolation region 250, e.g., to the left, right and below surface isolation region 250 in the view of FIG. 2, are regions of main-FET 150. For example, p-type material in mesas between primary trenches 210 is coupled to the main-FET source terminal 130 (FIG. 1), and such regions are overlaid with main-FET source metal (not shown).

Figure 3:
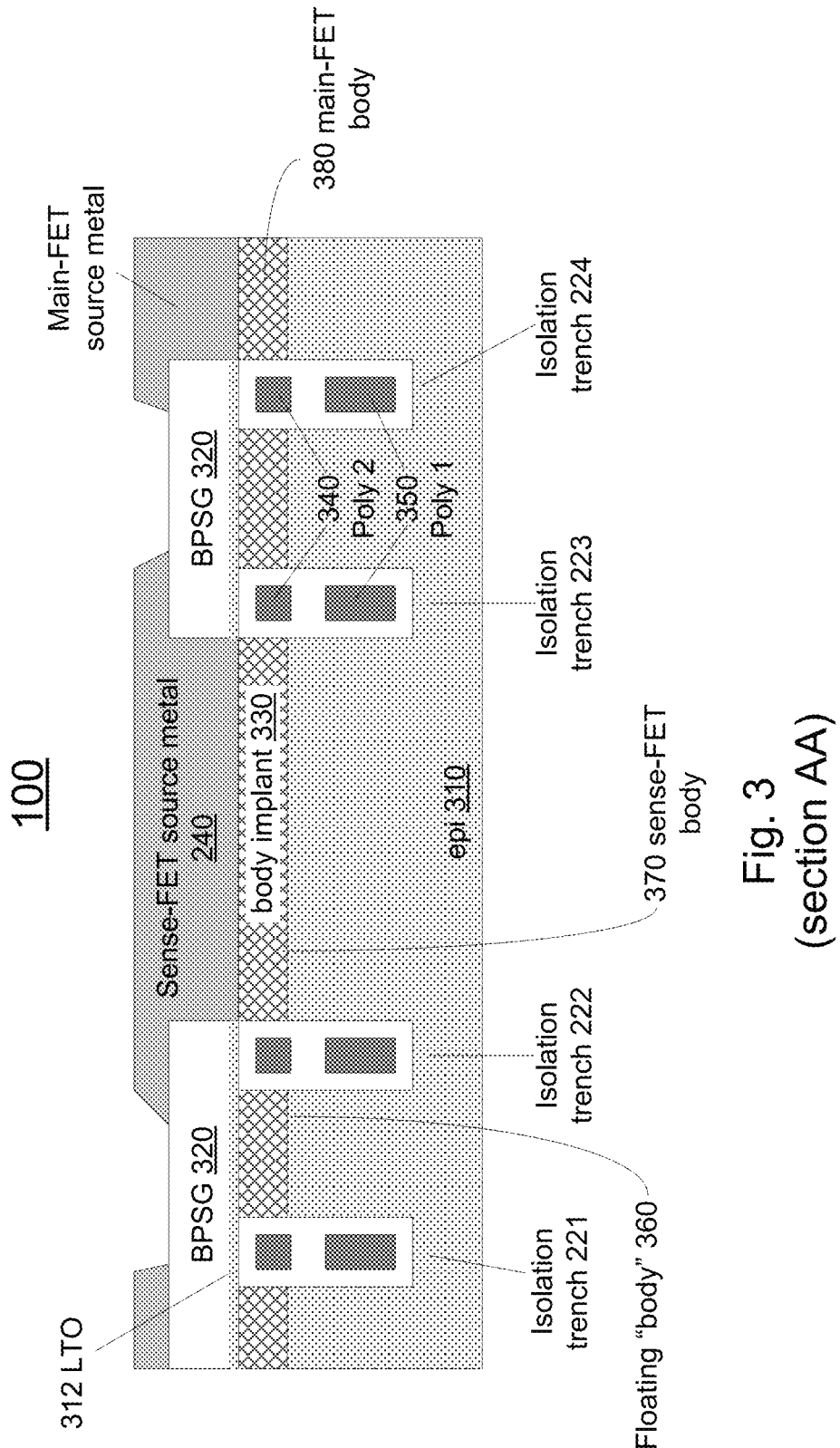
FIG. 3 illustrates an exemplary cross-sectional view of a portion of power semiconductor device, in accordance with embodiments of the present invention.

FIG. 3 illustrates an exemplary cross-sectional view of a portion of power semiconductor device 100, in accordance with embodiments of the present invention. FIG. 3 corresponds to cross section AA of FIG. 2. The view of FIG. 3 is taken along a mesa, e.g., between primary trenches 210 (FIG. 2), cutting an active region of sense-FET 160 (FIG. 1A). Power semiconductor device 100 comprises an epitaxial layer 310, e.g., N$^-$, formed on an N$^+$ substrate (not shown). A metallic drain contact (not shown) is typically formed on the bottom the substrate. Isolation trenches 221, 222, 223 and 224 are formed in epitaxial layer 310. As illustrated, isolation trenches 221, 222, 223 and 224 are perpendicular to the primary trenches 210. However, a wide variety of angles between isolation trenches 221-224 and primary trenches 210, e.g., from about 40 degrees to 90 degrees, are well suited to embodiments in accordance with the present invention.

Primary trenches 210 are above and below the plane of FIG. 3. The isolation trenches 221-224 should be deeper than the drain-body PN junction, and may be about the same depth as the primary trenches 210. Such a depth establishes a physical barrier between the source of the sense-FET 160 and the source of the main-FET 150. Thus, in accordance with embodiments of the present invention, the body implant may be performed without a mask, hence making the manufacturing process more cost effective.

Within each trench 221-224 there are two polysilicon electrodes, poly 1 (350) and poly 2 (340), separated by oxide, e.g., silicon dioxide. The top electrode, poly 2 (340), is coupled to the gate terminal, and the bottom electrode, poly 1 (35), is coupled to the source terminal. Power semiconductor device 100 additionally comprises a body implant 330, e.g., P$^+$ doping, typically at a depth below the surface of epitaxial layer 310. The implant region 360 between isolation trenches 221 and 222, and between isolation trenches 223 and 224 is left floating to create a buffer region between the body region 370 of the sense-FET and the electrically separate body region of the main-FET 380, thus improving the electrical isolation of the two FETs with minimal distance separating the two body regions 370 and 380.

The region between isolation trenches 221 and 222, and between isolation trenches 223 and 224 is a part of surface isolation region 250 (FIG. 2). Surface isolation region 250 is covered with an insulator, for example, borophosphosilicate glass (BPSG) 320. There is generally a layer 312 of low temperature oxide (LTO) underneath BPSG 320. The BPSG 320 isolates both sense-FET source metal 240 and main-FET source metal from one another and from the floating body implant 360.

Sense-FET source metal 240 couples the sources of the sense-FET 160 (not shown) and the sense-FET body 370 to a sense-FET source terminal of power semiconductor device 100, e.g., sense-FET source terminal 110 (FIG. 1A).

Figure 4:
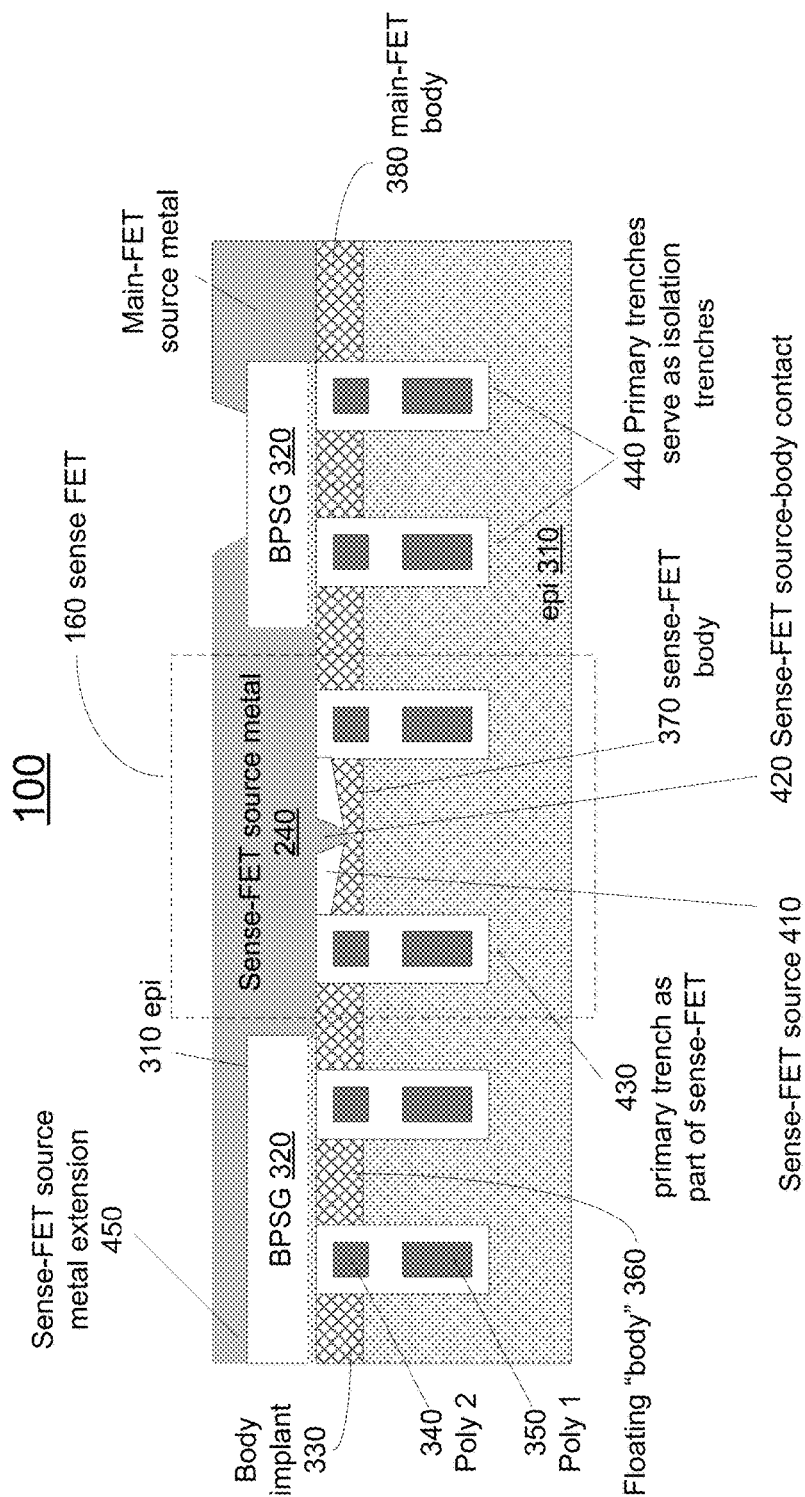
FIG. 4 illustrates an exemplary cross-sectional view of a portion of power semiconductor device, in accordance with embodiments of the present invention.

FIG. 4 illustrates an exemplary cross-sectional view of a portion of power semiconductor device 100, in accordance with embodiments of the present invention. FIG. 4 corresponds to cross section BB of FIG. 2. The view of FIG. 4 is taken through an active region of sense-FET 160 (FIG. 1A), perpendicular to primary trenches 210. Portions of several primary trenches 210, e.g., under surface isolation region 250 and BPSG 320, are utilized as isolation trenches 440. The top electrode, poly 2 (340), is coupled to the gate electrode, and the bottom electrode, poly 1 (350), is coupled to the source of the main-FET. Portions of different primary trenches 210 are used as trenches 430 to form sense-FET 160. It is to be appreciated FIG. 4 illustrates only two trenches as part of a sense-FET 160 for clarity. There would typically be many more trenches 430 within a sense-FET 160.

Sense-FET 160 comprises a sense-FET source 410, which is typically an N⁺ implant at or near the top of epitaxial layer 310. Sense-FET 160 also comprises a sense-FET source-body contact 420. Also illustrated in FIG. 4 is a sense-FET source metal extension 450, for example, used to route sense-FET source metal extension to a sense-FET source contact, e.g., sense-FET source terminal 110 of FIG. 1A.

Figure 5:
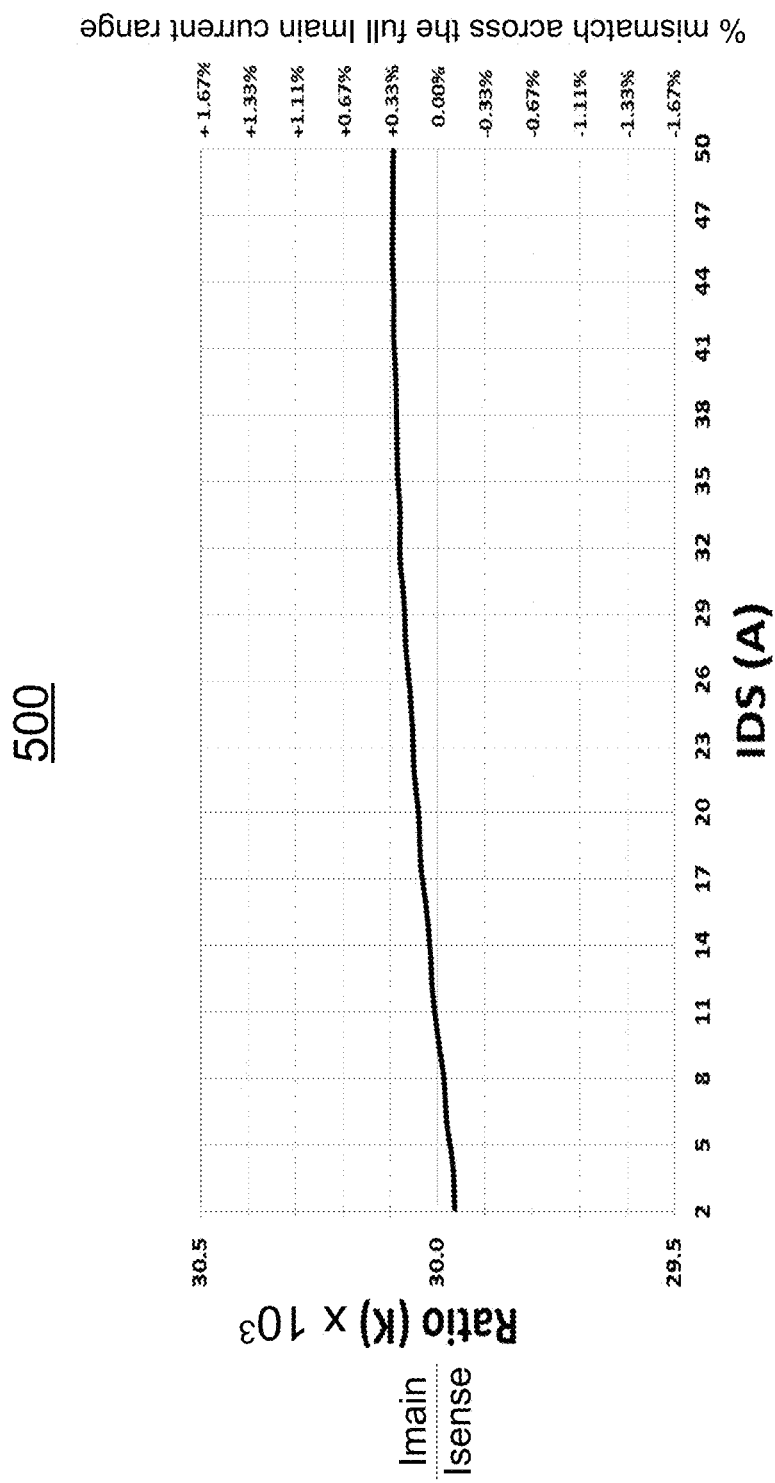
FIG. 5 illustrates a graph of experimental measurements taken on prototype devices constructed in accordance with embodiments of the present invention.

FIG. 5 illustrates a graph 500 of experimental measurements taken on prototype devices constructed in accordance with embodiments of the present invention. Graph 500 illustrates a current sense ratio (CSR), e.g., a ratio of Imain/Isense, on the left abscissa, across a range of drain-source currents, Ids, of the main-FET, also known as Imain, from 2 amps to 50 amps (ordinate). The ratio is at least $2.99 \times 10^4$, e.g., at 2 amps, and may be as high as $3.1 \times 10^4$, e.g., at 50 amps. In contrast, the highest claimed CSR under the conventional art known to applicants at this time is approximately $1.2 \times 10^3$.

Graph 500 of FIG. 5 also illustrates a percentage mismatch across the full main current range on the right abscissa. The mismatch describes the accuracy of the ratio of Imain/Isense. The mismatch is very small, e.g., within a range of +/−0.33 percent across a range of Ids from 2 amps to 50 amps. Thus, the prototype very accurately indicates Ids of the main-FET.

In accordance with embodiments of the present invention, a current sense MOSFET in a vertical trench MOSFET may be formed without additional process steps or additional mask layers in comparison to process steps and mask layers required to produce a corresponding vertical trench MOSFET by itself. For example, the perpendicular isolation trenches, e.g., isolation trenches 221-224 of FIG. 2, may be formed utilizing the same process steps and masks that form the primary trenches 210 of FIG. 2. It is appreciated that several masks, including, for example, a trench mask and metallization masks, will be different between embodiments in accordance with the present invention and the conventional art. For example, a single mask for forming FET trenches, e.g., primary trenches 210 (FIG. 2) and perpendicular isolation trenches, e.g., isolation trenches 221-224 (FIG. 2), is novel and unique, in accordance with embodiments of the present invention. However, the processes and numbers of masks may be the same.

Figure 6:
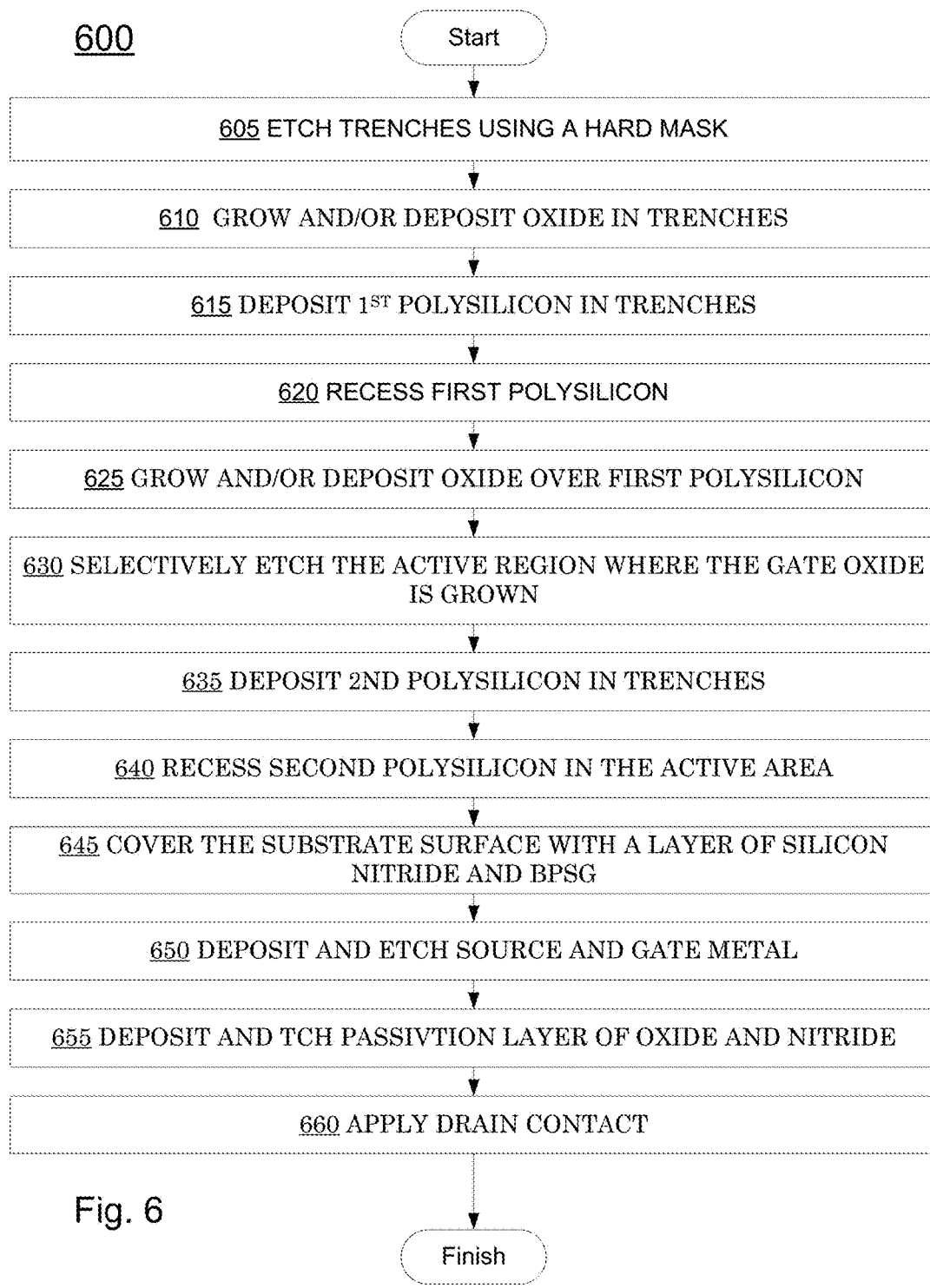
FIG. 6 illustrates an exemplary process flow for constructing a current sense MOSFET in a vertical trench MOSFET, in accordance with embodiments of the present invention.

FIG. 6 illustrates an exemplary process flow 600 for constructing a current sense MOSFET in a vertical trench MOSFET, for example, power semiconductor device 100 of FIG. 1A, in accordance with embodiments of the present invention. In 605, a plurality of trenches are etched with a hard mask to a depth, e.g., of typically a few micrometers. The trenches include, for example, primary trenches, e.g., primary trenches 210 (FIG. 2) and isolation trenches, e.g., isolation trenches 221-224, formed at an angle to the primary trenches. The primary trenches and isolation trenches may be etched to about the same depth, but that is not required.

In another embodiment, the vertical trenches are made slightly wider than primary trenches 210 such that when both trenches are etched (at the same process step) the vertical trenches are somewhat deeper than the primary trenches.

In 610, thermal oxide is grown followed by a deposited oxide inside the trench. In 615, first polysilicon, e.g., poly 1 (350) of FIG. 3, is deposited inside the trench. The first polysilicon may be doped with a high concentration of Phosphorus. In 620, the first polysilicon is recessed back to a desired depth, typically on the order of 1 micrometer. In 625, a second oxide layer is grown or deposited over and above the first polysilicon. In 630, a selective oxide etch is performed to etch the active region where the gate oxide is grown.

In 635, second polysilicon, e.g., poly 2 (340) of FIG. 3, is deposited. In 640, the second polysilicon is recessed in the active area to allow a layer of deposited oxide the fill the top of the trenches by a fill and etch back process. The body and source implants should be introduced consecutively. In 645, a layer of silicon nitride and doped oxide is used to cover the surface before contacts are etched to silicon, first polysilicon and second polysilicon.

In 650 a layer of metal is deposited and etched forming the gate and source contacts. It is appreciated that the source metal patterns of embodiments in accordance with the present invention differ from a conventional vertical MOSFET, for example, to accommodate the separate sense source of the novel sense-FET. In addition, there is no source metal in an isolation region around the sense-FET.

In 655 a passivation layer of oxide and nitride are deposited over the metallization and etched. In 660 a metal layer is deposited forming the backside drain contact.

In accordance with embodiments of the present invention, a sense diode may be established proximate the top body of a relatively larger split gate MOSFET, known as the "main-FET." Such a sense diode may be used to indicate temperature of the main-FET, in some embodiments. Temperature of a main-FET may be used for numerous purposes, e.g., to shut down a device responsive to an over-temperature condition. A sense diode may also be used to measure gate voltage of the main-FET, in some embodiments. Measuring gate voltage of a main-FET may be desirable when the gate terminal of a main-FET is not exposed, e.g., in packaged, high function devices such as driver MOS ("DrMOS") devices.

Figure 7A:
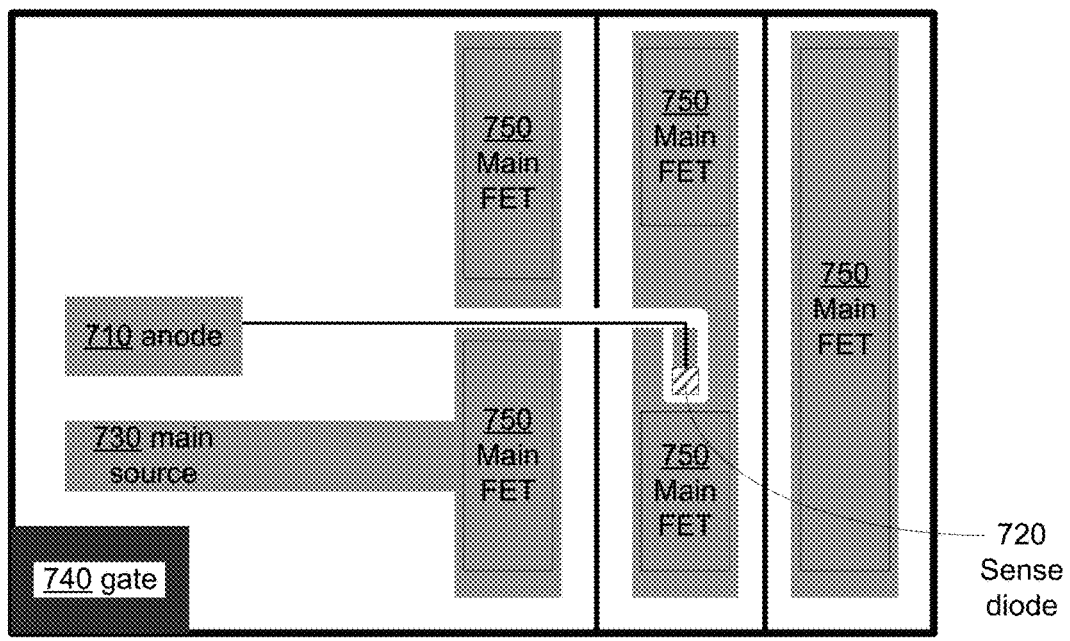
FIG. 7A illustrates a plan view of an exemplary sense diode in a power semiconductor device, in accordance with embodiments of the present invention.

FIG. 7A illustrates a plan view of an exemplary sense diode 720 in a power semiconductor device 700, in accordance with embodiments of the present invention. A principal function of power semiconductor device 700 is to function as a power MOSFET, e.g., to control a drain source current through the power MOSFET. Power semiconductor device 700 comprises large areas of main-FET 750. For example, main-FET 150 comprises numerous trenches comprising gate and shield electrodes, and mesas in-between the trenches comprising source and body regions. The main-FET 750 comprises a gate coupled to a gate terminal 740, for example, a bond pad. The main-FET 750 comprises a source coupled to a main-FET source terminal 730. The drain of the MOSFET 750 is outside, e.g., below, the plane of FIG. 7A. The function and structure of main-FET 750, main source 730 and gate 740 are generally equivalent to the comparable structures of device 100, as illustrated in FIG. 1A.

Power semiconductor device 100 comprises a sense-diode 720, formed within a region of the main-FET 750, in accordance with embodiments of the present invention. It is appreciated that die area of main-FET 750 is very much greater than die area of sense-diode 720. The cathode terminal of sense-diode 720 is in common with the drain terminal of main-FET 750, outside the plane of FIG. 7A. The anode terminal of sense-diode 720 is coupled to anode terminal 710., e.g., a bond pad.

Figure 7B:
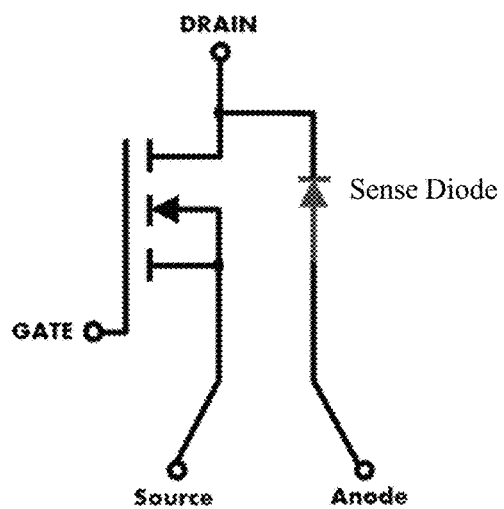
FIG. 7B illustrates an exemplary schematic symbol for power semiconductor device, in accordance with embodiments of the present invention.

FIG. 7B illustrates an exemplary schematic symbol for power semiconductor device 700, in accordance with embodiments of the present invention.

It is to be appreciated that sense-diode 720 is structurally very similar to sense-FET 160 of FIGS. 1A, 2, 3 and 4. The isolation trenches that isolate sense-diode 720 are equivalent to the isolation trenches that isolate sense-FET 160. The salient differences between sense-FET 160 and sense-diode 720 are that sense-diode 720 may lack a source implant 410 and a source-body contact 420 (FIG. 4), and the two poly layers within the trenches are connected differently.

FIG. 8 illustrates an exemplary cross-sectional view of a portion of power semiconductor device 700, in accordance with embodiments of the present invention. FIG. 8 is generally equivalent to the cross section illustration of FIG. 4. The view of FIG. 8 is taken through an active region of sense-diode 720 (FIG. 7A), perpendicular to primary trenches of main-FET 750. Portions of several primary trenches, e.g., under surface isolation regions and BPSG 825, are utilized as isolation trenches 840. The top electrode, poly 2 (842), is coupled to the gate electrode, and the bottom electrode, poly 1 (841), is coupled to the source of the main-FET. Portions of different primary trenches are used as trenches 830 to form sense-diode 820. It is to be appreciated FIG. 8 illustrates only two trenches as part of a sense-diode 720 for clarity. There would typically be many more trenches 830 within a sense-diode 720.

Sense diode 720 comprises a sense-diode anode 870. Optionally, sense diode 720 may comprise a sense-diode anode contact 851, similar to a source-body contact of a MOSFET, e.g., sense-FET source-body contact 420 of FIG. 4. Also illustrated in FIG. 8 is a sense-FET source metal extension 850, for example, used to route sense-FET source metal extension to a sense-FET source contact, e.g., sense-FET anode contact 710 of FIG. 7A.

In accordance with embodiments of the present invention, sense-diode 720 may be used to sense temperature of the device, e.g., a temperature of main-FET 750 and/or to indicate the voltage of gate 740.

To measure temperature, in accordance with embodiments of the present invention, the first field plate, poly 1 (841), should be electrically coupled to the anode of the sense-diode 720, which has a separate terminal distinct from the source of the main-FET 750 (or a sense-FET, if present). The second field plate, poly 2 (842), uses the gate structure and should be electrically coupled to the anode (not to the gate terminal 740 of the main-FET 750). The cathode side of the diode is common to the drain of the main-FET 750 (and a sense-FET, if present). In this embodiment, the diode is not affected by the main-FET 750 gate voltage and exhibits good diode characteristics that can be calibrated as a function of temperature for temperature sensing. Accordingly, this novel structure of a vertical MOS diode within a vertical trench MOSFET may be used to sense temperature of the device via well known methods.

Figure 9:
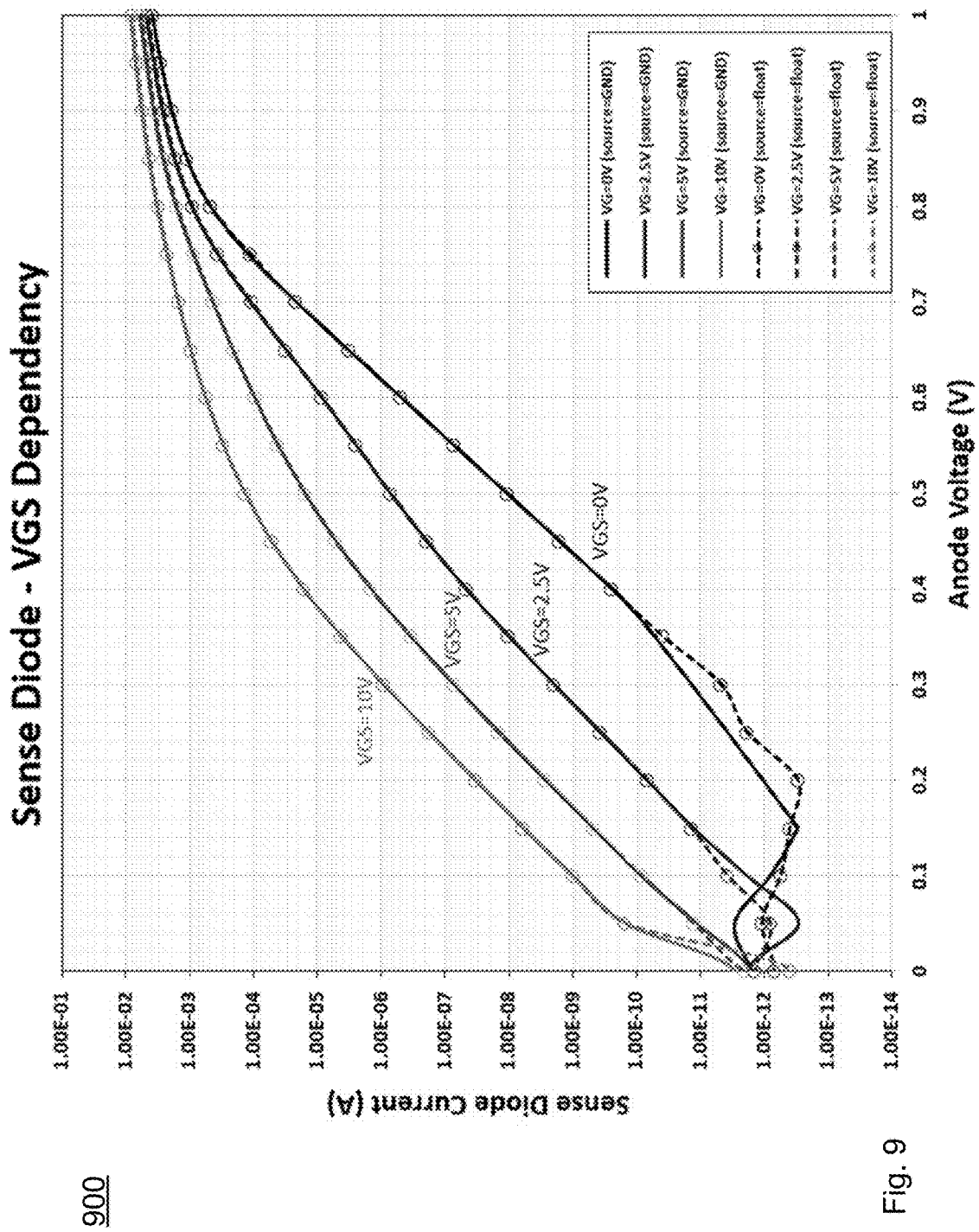
FIG. 9 illustrates exemplary characteristics of an exemplary sense-diode as a function of gate voltage, in accordance with embodiments of the present invention.

To indicate gate voltage, in accordance with embodiments of the present invention, the second field plate, poly 2 (842), should be electrically coupled to the gate terminal of the main-FET 750. In this embodiment, the sense-diode 720 characteristics change as a function of the gate voltage. For example, the sense-diode 720 current-voltage relation depends on gate terminal voltage if the second field plate, poly 2 (842), is electrically coupled to the gate terminal. In this embodiment, the sense-diode 720 current-voltage characteristic may be used to indicate the gate voltage, at a given temperature, by calibrating the sense-diode 720 voltage at a given current to the gate voltage. This can be useful if there is no gate terminal exposed to the outside, for example, as is the case of a Driver-MOS ("DrMOS") package. FIG. 9, below, illustrates exemplary characteristics of the sense-diode 720 as a function of the gate voltage, to facilitate determining gate voltage.

FIG. 9 illustrates exemplary characteristics 900 of an exemplary sense-diode 720 as a function of gate voltage, in accordance with embodiments of the present invention. Characteristics 900 may be used to determine gate voltage based on diode current and anode voltage. The modulation of the current-voltage characteristics of the sense-diode 720 is seen here depending on the gate voltage, as applied to the second field plate, poly 2 (842) as illustrated in FIG. 8. When Vgs=0 volts, the channel is off, and the sense-diode 720 is working in a "pure diode mode." As Vgs increases, the sense-diode 720 is modulated by the parasitic MOSFET. For example, when Vgs=5 volts, the channel is on and channel current dominates the characteristics. The sense-diode 720 in this mode of operation can basically "detect the gate voltage" by calibrating the current flowing through the diode, for example, at 1 μa of drain-source current, to the following Table 1:

TABLE 1

| |
|---|
| Vdiode @ 1 μa = 0.62 V => Vgs = 0 V |
| Vdiode @ 1 μa = 0.51 V => Vgs = 2.5 V |
| Vdiode @ 1 μa = 0.39 V => Vgs = 5 V |
| Vdiode @ 1 μa = 0.24 V => Vgs = 10 V |

It is to be appreciated that embodiments in accordance with the present invention are well suited to the formation and use of both a sense-FET, e.g., sense-FET 160 of FIG. 1A, and a sense-diode, e.g., sense-diode 720 of FIG. 7A.

Figure 10A:
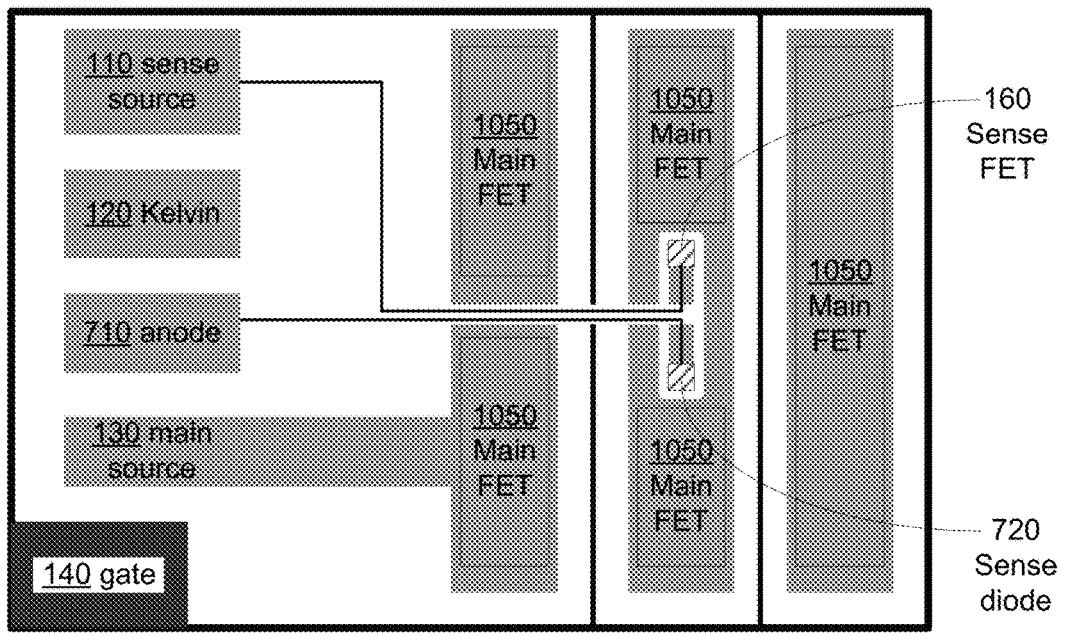
FIG. 10A illustrates a plan view of an exemplary current sense MOSFET (sense-FET) and an exemplary sense diode in a power semiconductor device, in accordance with embodiments of the present invention.

FIG. 10A illustrates a plan view of an exemplary current sense MOSFET (sense-FET) 160 and an exemplary sense diode 720 in a power semiconductor device 1000, in accordance with embodiments of the present invention. A principal function of power semiconductor device 1000 is to function as a power MOSFET, e.g., to control a drain source current through the power MOSFET. Power semiconductor device 1000 comprises large areas of main-FET 1050. For example, main-FET 1050 comprises numerous trenches comprising gate and shield electrodes, and mesas in-between the trenches comprising source and body regions. The main-FET 1050 comprises a gate coupled to a gate terminal 140, for example, a bond pad. The main-FET 1050 comprises a source coupled to a main-FET source terminal 130. The drain of the MOSFET 1050 is outside, e.g., below, the plane of FIG. 1A.

Power semiconductor device 1000 comprises a sense-FET 160, formed within a region of the main-FET 1050, in accordance with embodiments of the present invention. It is appreciated that die area of main-FET 1050 is very much greater than die area of sense-FET 160. The gate and drain of the sense-FET 160 are in common, e.g., in parallel, with the gate and drain of the main-FET 1050. The source of the sense-FET 160 is coupled to a sense source terminal 110, e.g., a bond pad. The sense-FET outputs a voltage corresponding to current in the main-FET 1050. The node Kelvin may be coupled to a terminal 120 for use off the die of power semiconductor device 100, in some embodiments. The voltage Kelvin may also, or alternatively, be used by circuitry (not shown) on the die of power semiconductor device 1000, for example, to turn main-FET 1050 off for over-current protection.

Power semiconductor device 1000 further comprises a sense-diode 720, formed within a region of the main-FET 1050, in accordance with embodiments of the present invention. It is appreciated that die area of main-FET 1050 is very much greater than die area of sense-diode 720. The cathode of the sense-diode 720 is in common with the drain of the main-FET 1050. The anode of sense-diode 720 is coupled to an anode terminal, e.g., a bond pad 710. The sense-diode 720 may be used to measure temperature of the device and/or gate voltage, as previously described. A power MOSFET device comprising at least two sense-diodes is envisioned, and is considered within the scope of the present invention. For example, multiple sense diodes may be configured to measure temperature in different regions of a MOSFET. In another embodiment, at least one sense diode may be configured to indicate gate voltage in conjunction with one or more sense diodes configured to measure temperature.

Similarly, a power MOSFET device comprising at least two sense-FETs is envisioned, and is considered within the scope of the present invention. For example, due to temperature and manufacturing process variations across a large die of a power MOSFET, current within the MOSFET may not be uniformly distributed. Accordingly, it may be advantageous to measure current via multiple sense-FETs at different locations throughout such a device. As a beneficial result of the novel high current sense ratio afforded by embodiments of the present invention, small variations in current may be observed in this manner.

Figure 10B:
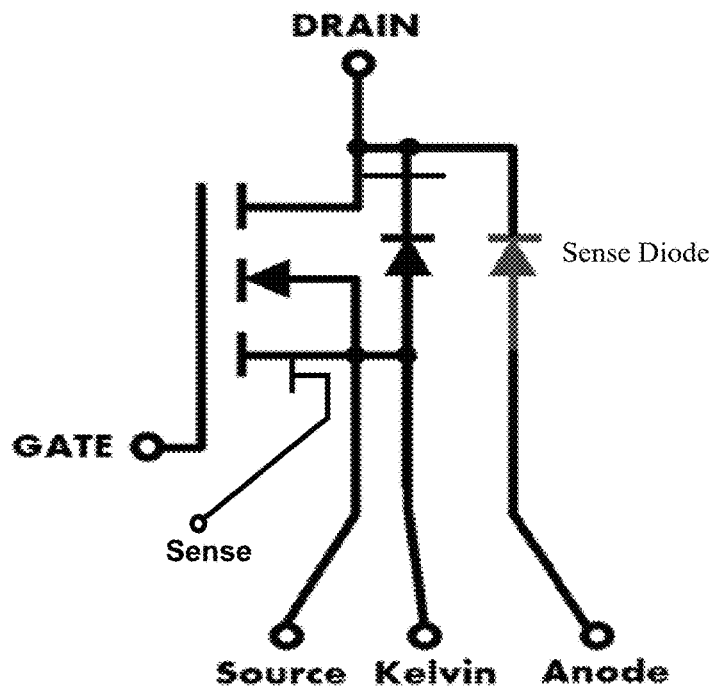
FIG. 10B illustrates an exemplary schematic symbol for power semiconductor device, in accordance with embodiments of the present invention.

FIG. 10B illustrates an exemplary schematic symbol for power semiconductor device 1000, in accordance with embodiments of the present invention.

It is to be appreciated that no additional masks or manufacturing process steps are required to form sense-FET 160 and/or sense-diode 720. Both sense-FET 160 and sense-diode 720 utilize structures common to a main-FET, e.g., trenches and poly layers, for their function, and further utilize structures common to a main-FET, e.g., trenches and BPSG, for isolation. Accordingly, the benefits of a sense-FET 160 and/or sense-diode 720 may be realized with no additional manufacturing cost in comparison to a trench MOSFET.

Embodiments in accordance with the present invention are well suited to a variety of trench MOSFETs, including, for example, single gate trench MOSFETs, split gate charge balanced trench MOSFETs, Hybrid Split Gate MOSFETs, for example, as disclosed in co-pending, commonly owned U.S. patent application Ser. No. 13/460,567, filed Apr. 20, 2012, to Bobde et al., entitled "Hybrid Split Gate Semiconductor," which is hereby incorporated herein by reference in its entirety, and dual trench MOSFETs, for example, as described in the publication: "Poly Flanked VDMOS (PFVDMOS): A Superior Technology for Superjunction Devices" by K. P. Gan, Y. C. Liang, G. Samudra, S. M. Xu, L. Yong, IEEE Power Electronics Specialist Conference, 2001.

Embodiments in accordance with the present invention provide systems and methods for current sense metal oxide semiconductor field effect transistors (MOSFETs) in vertical trench MOSFETs. In addition, embodiments in accordance with the present invention provide systems and methods for current sense MOSFETs in vertical trench MOSFETs that are integral to the main-FET. Further, embodiments in accordance with the present invention provide systems and methods for current sense MOSFETs in vertical trench MOSFETs that are integral to the main-FET. Yet further embodiments in accordance with the present invention provide systems and methods for a sensing diode to sense temperature and/or gate voltage of the main-FET. Still further, embodiments in accordance with the present invention provide systems and methods for systems and methods for current sense MOSFETs and/or sense diodes in vertical trench MOSFETs that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the below claims.

What is claimed is:

1. A semiconductor device comprising:
   a main vertical trench metal oxide semiconductor field effect transistor (main-MOSFET) comprising:
      a plurality of parallel main trenches, wherein said main trenches comprise a first electrode coupled to a gate of said main-MOSFET; and
      a plurality of main mesas between said main trenches, wherein said main mesas comprise a main source and a main body of said main-MOSFET; and
   a sense-diode comprising:
      a plurality of sense-diode trenches, wherein each of said sense-diode trenches comprises a portion of one of said main trenches; and
      a plurality of sense-diode mesas between said source-FET trenches, wherein said sense-diode mesas comprise a sense-diode anode that is electrically isolated from said main source of said main-MOSFET.

2. The semiconductor device of claim 1 wherein said main FET trenches comprise a first electrode coupled to said gate of said main-MOSFET and a second electrode electrically isolated from said main gate electrode.

3. The semiconductor device of claim 1 wherein portions of said main MOSFET surrounds said sense-diode on at least three sides.

4. The semiconductor device of claim 1 further comprising a surface isolation region free of surface metallization between said sense-diode and said main MOSFET on said at least three sides.

5. The semiconductor device of claim 4 wherein portions of said surface isolation region are formed between isolation trenches crossing said parallel main trenches.

6. The semiconductor device of claim 1 further comprising:
   at least two first isolation trenches crossing said parallel main trenches.

7. The semiconductor device of claim 6 further comprising:
   a plurality of second isolation trenches, formed outside of an active area of said sense-diode, wherein each of said second isolation trenches comprises a portion of one of said main trenches.

8. A semiconductor device comprising:
   a vertical trench main MOSFET (main-FET) configured to control a drain source current;
   a vertical trench sense-diode (sense-diode) configured to produce a signal corresponding to a temperature of said main-FET; and
   an isolation trench configured to isolate said main-FET from said sense-diode,
   wherein said isolation trench is formed at an angle to, and intersects a plurality of trenches of said main-FET.

9. The semiconductor device of claim 8 wherein vertical trenches of said main-FET comprise at least two vertically aligned electrodes, electrically insulated from one another.

10. The semiconductor device of claim 9 wherein a lower of said electrodes is coupled to a source of said main-FET.

11. The semiconductor device of claim 9 wherein an upper of said electrodes is coupled to a gate of said main-FET.

12. The semiconductor device of claim 9 wherein said angle is greater than 40 degrees.

13. The semiconductor device of claim 9 wherein said angle is substantially 90 degrees.

14. The semiconductor device of claim 9 wherein a cathode of said sense-diode and a drain terminal of said main-FET are electrically coupled.

15. A semiconductor device comprising:
a main-FET comprising a main-FET source region;
a sense-diode configured to produce a signal corresponding to a temperature of said main-FET, said sense-diode comprising:
  a plurality of first trenches formed in a first horizontal dimension configured to isolate a sense-diode anode region from said main-FET source region,
  wherein each of said trenches comprises multiple alternating layers of conductors and dielectrics in a vertical dimension; and
at least one second trench in a perpendicular horizontal dimension located between said sense-diode anode region and said main-FET source region and configured to isolate said sense-diode anode region from said main-FET source region; and
a buffer region separating said sense-diode anode region and said main-FET source region.

16. The semiconductor device of claim 15 wherein trenches of said main FET comprise a first electrode coupled to a gate electrode of said main-MOSFET and a second electrode electrically isolated from said gate electrode.

17. The semiconductor device of claim 15 further comprising a surface isolation region free of surface metallization between said sense-diode and said main MOSFET on said at least three sides of said sense-diode.

18. The semiconductor device of claim 15 wherein electrodes within trenches of said sense-diode are electrically isolated from electrodes within trenches of said main-FET.

19. The semiconductor device of claim 15 wherein first and second electrodes within trenches of said sense-diode are electrically coupled to the anode terminal of said sense-diode.

* * * * *